US012796128B2

(12) United States Patent
Jang

(10) Patent No.: US 12,796,128 B2
(45) Date of Patent: Nov. 10, 2026

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 636 days.

(21) Appl. No.: 17/969,301

(22) Filed: Oct. 19, 2022

(65) Prior Publication Data

US 2023/0118540 A1 Apr. 20, 2023

(30) Foreign Application Priority Data

Oct. 19, 2021 (KR) ........................ 10-2021-0139184

(51) Int. Cl.

*H10F 39/00* (2025.01)
*H10F 39/12* (2025.01)
*H10F 39/18* (2025.01)

(52) U.S. Cl.

CPC ....... *H10F 39/8033* (2025.01); *H10F 39/014* (2025.01); *H10F 39/18* (2025.01); (Continued)

(58) Field of Classification Search

CPC .. H10F 39/802; H10F 39/8023; H10F 39/803; H10F 39/8037; H10F 39/80373; H10F 39/813

See application file for complete search history.

(56) References Cited

U.S. PATENT DOCUMENTS 9,264,676 B2 2/2016 Cohen et al.
2014/0367552 A1* 12/2014 Hynecek ............ H10F 39/8037 257/230

(Continued)

FOREIGN PATENT DOCUMENTS

CN 103855177 A1 6/2014
CN 104681571 A 6/2015

(Continued)

OTHER PUBLICATIONS

Ebiko, Y et al., "Low power consumption and high resolution 1280×960 Gate Assisted Photonic Demodulator pixel for indirect Time of flight," Sony Semiconductor Solutions Corporation, 2020 IEEE International Electronic Devices Meeting, 4 pages.

(Continued)

*Primary Examiner* — Kevin Parendo
(74) *Attorney, Agent, or Firm* — Ashurst Perkins Coie US LLP

(57) ABSTRACT

An image sensing device may include a plurality of pixel regions included in a substrate, a plurality of taps structured to generate an electric potential difference in the substrate and capture photocharges generated by the plurality of pixel regions and migrated by the electric potential difference, wherein each of the taps comprises a control node disposed in the substrate and doped with a first conductive type impurity, a detection node disposed in the substrate and doped with a second conductive type impurity, and a control gate structured to include a gate electrode and a gate dielectric layer for electrically isolating the gate electrode from the substrate, wherein the control node is disposed at a first side of the detection node, and the control gate is disposed at a second side of the detection node, wherein the second side is an opposite side of the first side.

19 Claims, 15 Drawing Sheets

(52) U.S. Cl.
CPC ......... *H10F 39/199* (2025.01); *H10F 39/802* (2025.01); *H10F 39/8023* (2025.01); *H10F 39/803* (2025.01); *H10F 39/8037* (2025.01); *H10F 39/80373* (2025.01); *H10F 39/813* (2025.01)

(56) References Cited

U.S. PATENT DOCUMENTS

| | | | | |
|---|---|---|---|---|
| 2015/0256780 | A1* | 9/2015 | Lin ..................... | H10F 39/8037<br>348/322 |
| 2020/0029047 | A1 | 1/2020 | Jin et al. | |
| 2020/0304741 | A1 | 9/2020 | Dielacher et al. | |
| 2020/0314365 | A1 | 10/2020 | Sano | |
| 2021/0104569 | A1 | 4/2021 | Kwak et al. | |
| 2021/0134854 | A1* | 5/2021 | Poikonen ............ | H10F 39/8033 |
| 2021/0141068 | A1 | 5/2021 | Franke et al. | |
| 2021/0159256 | A1 | 5/2021 | Tsuboi | |
| 2021/0210005 | A1 | 7/2021 | Zhou et al. | |
| 2021/0270941 | A1 | 9/2021 | Watanabe | |
| 2021/0364604 | A1* | 11/2021 | Isogai ................... | G01S 7/4816 |
| 2021/0408094 | A1 | 12/2021 | Jang et al. | |
| 2022/0157866 | A1* | 5/2022 | Byun .................... | H10F 39/812 |
| 2022/0208815 | A1 | 6/2022 | Jang | |
| 2022/0223639 | A1* | 7/2022 | Jang ...................... | H10F 39/807 |
| 2023/0118540 | A1 | 4/2023 | Jang | |

FOREIGN PATENT DOCUMENTS

| | | | |
|---|---|---|---|
| CN | 112188128 | A | 1/2021 |
| CN | 212696100 | U | 3/2021 |
| CN | 113365006 | A | 9/2021 |
| CN | 113451338 | A | 9/2021 |
| CN | 115996324 | A | 4/2023 |
| EP | 3598167 | A1 | 1/2020 |
| JP | 2015510259 | A | 4/2015 |
| JP | 2017522727 | A | 8/2017 |
| JP | 2018117117 | A | 7/2018 |
| JP | 2020515085 | A | 5/2020 |
| JP | 2020516200 | A | 5/2020 |
| KR | 20170040124 | A | 4/2017 |
| KR | 20200009643 | A | 1/2020 |
| KR | 20220000562 | A | 1/2022 |

OTHER PUBLICATIONS

Request for the Submission of an Opinion for KR Appl. No. 10-2021-0139184, mailed on Jun. 27, 2025, 12 pages with English translation.
Notice of Allowance for CN Appl. No. 202310087630.6, mailed on Aug. 13, 2026, 8 pages with English translation.
Notice of Reasons for Refusal for JP Appl. No. 2022-167156, mailed on Sep. 29, 2026, 8 pages with English translation.

* cited by examiner

IMAGE SENSING DEVICE

CROSS-REFERENCES TO RELATED APPLICATION

This patent document claims the priority and benefits of Korean application number 10-2021-0139184, filed on Oct. 19, 2021, which is incorporated herein by reference in its entirety as part of the disclosure of this patent document.

TECHNICAL FIELD

Various embodiments generally relate to an image sensing device for sensing the distance to a target object.

BACKGROUND

An image sensor is a sensor device that detects light and captures an image using a photosensitive semiconductor material that reacts to light. With the recent development of computer and communication industries, the demand for advanced image sensors is increasing in various devices such as a smart phone, digital camera, game machine, IoT (Internet of Things), robot, security camera and medical micro camera.

The image sensors may be roughly divided into a CCD (Charge Coupled Device) image sensor and a CMOS (Complementary Metal Oxide Semiconductor) image sensor. CCD image sensors generate less noise and have a higher image quality than CMOS image sensors. However, CMOS image sensors are now widely used due to certain advantages over the CCD counterparts, including, e.g., various scanning methods. In addition, CMOS image sensors and signal processing circuitry can be integrated into a single chip, making it possible to miniaturize electronic devices at a low cost while achieving low power consumption. Such characteristics make CMOS image sensors better suited for implementations in mobile devices.

SUMMARY

Various embodiments of the disclosed technology relate to an image sensing device that includes time-of-flight (ToF) pixels structured to detect the distance between the image sensing device and a target object.

In an embodiment, an image sensing device may include a plurality of pixel regions included in a substrate and structured to detect incident light and generate photocharges corresponding to an intensity of the incident light, and a plurality of taps structured to generate an electric potential difference in the substrate and capture the photocharges generated by the plurality of pixel regions and migrated by the electric potential difference, wherein each of the taps comprises: a control node disposed in the substrate and doped with a first conductive type impurity; a detection node disposed in the substrate and doped with a second conductive type impurity different from the first conductive type; and a control gate structured to include a gate electrode and a gate dielectric layer for electrically isolating the gate electrode from the substrate, wherein the control node is disposed at a first side of the detection node, and the control gate is disposed at a second side of the detection node, wherein the second side is an opposite side of the first side.

In an embodiment, an image sensing device may include a substrate including a plurality of pixel regions structured to detect incident light and generate photocharges corresponding to an intensity of the incident light, a back side of the substrate being structured to receive incident light, and a plurality of taps included in the substrate and structured to be located closer to the front side than the back side, generate an electric potential difference in the substrate and capture the photocharges generated by the plurality of pixel regions and migrated by the electric potential difference, wherein each of the taps comprises a control node disposed in the substrate and doped with a first conductive type impurity, a detection node disposed in the substrate and doped with a second conductive type impurity different from the first conductive type, and a control gate structured to include a gate electrode and a gate dielectric layer for electrically isolating the gate electrode and the substrate from each other, wherein the control node, the detection node and the control gate of the tap are sequentially disposed in a diagonal direction of a pixel region including the tap.

In an embodiment, an image sensing device may include: a substrate including a back side on which light is incident and a front side facing the back side; and a plurality of taps configured to generate a potential gradient in the substrate, and capture photocharges which are generated by the light and migrated by the potential gradient. Each of the taps may include: a control node doped with a first conductive type impurity in the substrate; a detection node doped with a second conductive type impurity in the substrate, wherein the second conductive type is different from the first conductive type; and a control gate including a gate electrode and a gate dielectric layer for electrically isolating the gate electrode and the substrate from each other.

In an embodiment, an image sensing device may include: a substrate including a back side on which light is incident and a front side facing the back side; and a plurality of taps configured to generate a potential gradient in the substrate, and capture photocharges which are generated by the light and migrated by the potential gradient. Each of the taps may include: a control node doped with a first conductive type impurity in the substrate; a detection node doped with a second conductive type impurity in the substrate, wherein the second conductive type is different from the first conductive type; and a control gate including a gate electrode and a gate dielectric layer for electrically isolating the gate electrode and the substrate from each other, wherein the control node, the detection node and the control gate of the tap are sequentially disposed in a diagonal direction of a pixel including the tap.

In some embodiments, the image sensing device can improve the performance of the ToF pixels while reducing power consumed by the ToF pixels.

In addition, it is possible to provide various effects which are directly or indirectly understood through this document.

DETAILED DESCRIPTION

Hereafter, various embodiments of the present disclosure will be described with reference to the accompanying drawings. However, it should be noted that the present disclosure is not limited to specific embodiments, but includes various modifications, equivalents and/or alternatives.

The distance-measurement technology is a growing research field in various image sensing devices for various applications such as security devices, medical devices, vehicles, game machines, virtual reality/augmented reality (VR/AR) devices and mobile devices. Representative examples of the distance-measurement technology include triangulation, Time-of-Flight (ToF) technology and interferometry. The ToF method can be utilized in a wide range, has high processing speed, and can be implemented at low cost. Thus, the importance of the ToF method is rising.

The ToF method may be roughly divided into a direct method for measuring a distance by directly calculating a round trip time and an indirect method for measuring a distance using a phase difference, based on the common principle to measure a distance using emitted light and reflected and returning light. The direct method suitable for a long distance is often used in a vehicle and the like. The indirect method suitable for a short distance is used for a game machine or mobile camera which requires high processing speed. The indirect method requires a simple circuit configuration and less memories, and can be implemented at relatively low cost.

Figure 1:
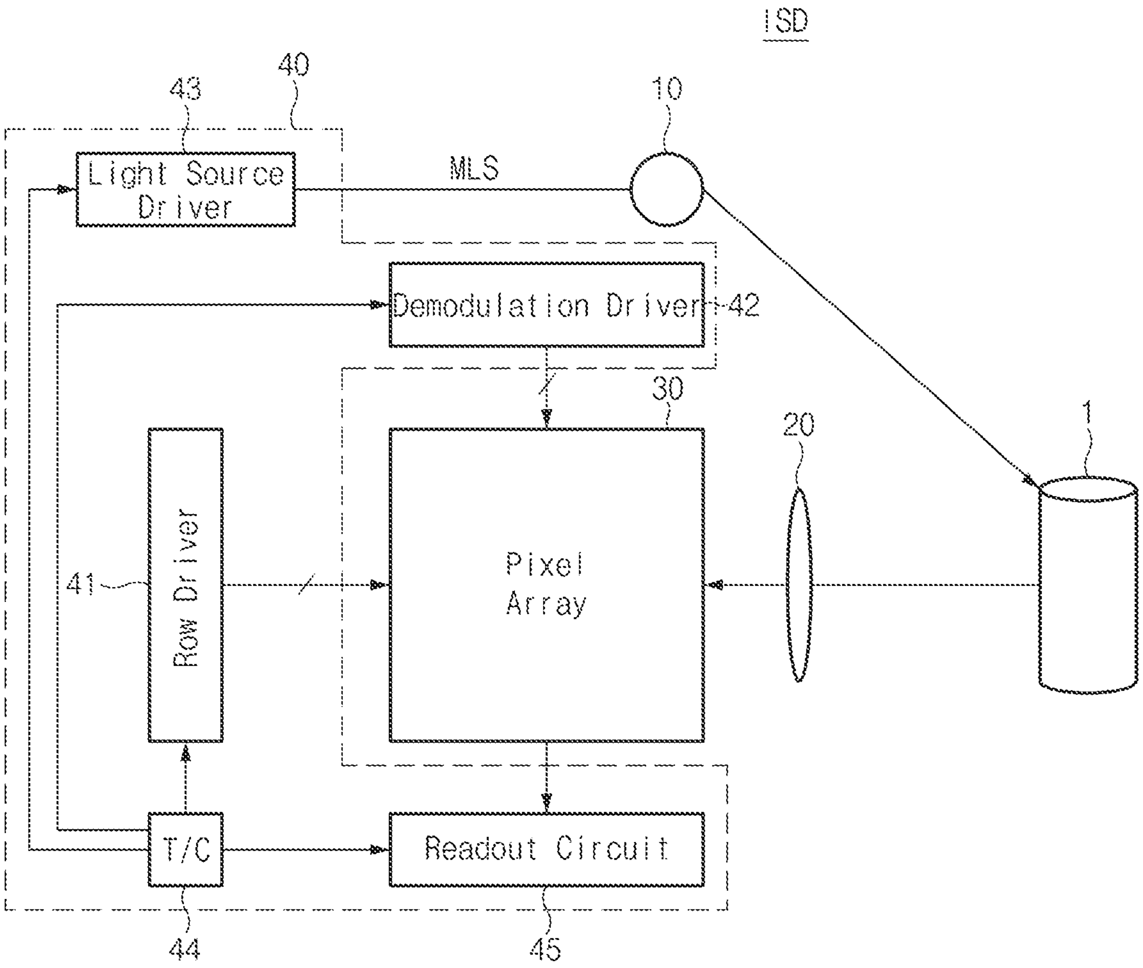
FIG. 1 is a diagram illustrating an example configuration of an image sensing device based on some embodiments of the disclosed technology.

FIG. 1 is a configuration diagram schematically illustrating a configuration of an image sensing device based on some embodiments of the disclosed technology.

Referring to FIG. 1, an image sensing device ISD may measure the distance between the image sensing device and a target object 1 by using a time-of-flight (ToF) method. Examples of the ToF method may include a direct ToF method and an indirect ToF method. The direct ToF method may measure the distance between the image sensing device ISD and the target object 1 by measuring the time it takes from when light is emitted toward the target object 1 and to when the light reflected from the target object 1 arrives at the image sensing device ISD. The indirect ToF method may be performed by emitting modulated light toward the target object 1, detecting light reflected from the target object 1, and indirectly measuring the distance between the image sensing device ISD and the target object 1 on the basis of the phase difference between the modulated light and the reflected light. In some implementations of the disclosed technology, the image sensing device ISD uses the indirect ToF method as will be discussed below. In other implementations, the image sensing device ISD uses the direct ToF method or other depth sensing or distance measuring methods. Furthermore, the target object 1 may include more than one object, or may indicate a scene captured by the image sensing device ISD.

The image sensing device ISD may include a light source 10, a lens module 20, a pixel array 30 and a control block 40.

The light source 10 emits light onto the target object 1 in response to a modulated light signal MLS provided from the control block 40. Examples of the light source 10 may include a laser diode (LD), a light emitting diode (LED), a near infrared laser (NIR), a point light source, a monochromatic illumination source, and a combination of these light sources and/or other laser sources. The LD or the LED emits a specific wavelength band of light (for example, near-infrared ray, infrared ray or visible light), and the monochromatic illumination source includes a white lamp and a monochromator. For example, the light source 10 may emit infrared light having a wavelength of 800 nm to 1,000 nm. The light emitted from the light source 10 may include light that is modulated at a preset frequency. In one example, the image sensing device ISD includes one light source 10 as illustrated in FIG. 1. In another example, the image sensing device ISD may include a plurality of light sources arranged around the lens module 20.

The lens module 20 may collect light reflected from the target object 1, and focus the collected light on pixels of the pixel array 30. For example, the lens module 20 may include a focusing lens having a glass or plastic surface or a cylindrical optical element. The lens module 20 may include a plurality of lenses aligned with an optical axis.

The pixel array 30 may include a plurality of unit pixels successively arranged in a 2D matrix. For example, the pixel array 30 may include a plurality of unit pixels successively arranged in column and row directions. The unit pixels may be formed in a semiconductor substrate, and each of the unit pixels may convert light that is incident on the unit pixels through the lens module 20 into an electrical signal corresponding to the intensity of the light, and output the electrical signal as a pixel signal. Here, the pixel signal may be a signal that indicates the distance between the image sensing device and the target object 1. The detailed structure and operation of each unit pixel will be described below with reference to FIG. 2 and the following drawings.

The control block 40 may control the light source 10 to emit light onto the target object 1 and activate and/or control the unit pixels of the pixel array 30 to process pixel signals corresponding to the light reflected from the target object 1, thereby measuring the distance to the surface of the target object 1.

Such a control block 40 may include a row driver 41, a demodulation driver 42, a light source driver 43, a timing controller (T/C) 44 and a readout circuit 45.

The row driver 41 and the demodulation driver 42 may be collectively referred to as a control circuit.

The control circuit may activate and/or control the unit pixels of the pixel array 30 in response to a timing signal provided by the timing controller 44.

The control circuit may generate a control signal to select and/or control one or more rows or row signal lines among a plurality of row lines of the pixel array 30. Such a control signal may include a demodulation control signal for generating an electrical potential difference or potential gradient within a substrate, a reset signal for controlling a reset transistor, a transmission signal for controlling transfer of photocharges accumulated in a detection node, a floating diffusion signal for providing an additional capacitance under a high luminance condition, and a selection signal for controlling a selection transistor.

The row driver 51 may generate the reset signal, the transmission signal, the floating diffusion signal and the selection signal, and the demodulation driver 42 may generate the demodulation control signal. In an embodiment, the row driver 41 and the demodulation driver 42 are configured as independent components, as show in FIG. 1. In another embodiment, the row driver 41 and the demodulation driver 42 may be incorporated into a single component, and may be disposed on one side of the pixel array 30.

The light source driver 43 may generate the modulated light signal MLS to operate the light source 10, and control signals generated by the timing controller 44 can be used to operate and/or control the light source 10. The modulated light signal MLS may be a signal modulated at a predetermined frequency.

The timing controller 44 may generate a timing signal for controlling the operations of the row driver 41, the demodulation driver 42, the light source driver 43 and the readout circuit 45.

The readout circuit 45 may generate pixel data by processing pixel signals outputted from the pixel array 30, under control of the timing controller 44. In one example, the pixel data includes digital signals that are converted from the pixel signals generated by the pixel array 30. In some implementations, the readout circuit 45 may include a correlated double sampler (CDS) for performing correlated double sampling on the pixel signals generated by the pixel array 30. The readout circuit 45 may include an analog-digital converter for converting the output signals of the CDS into digital signals. Furthermore, the readout circuit 45 may include a buffer circuit to temporarily store pixel data generated by the analog-digital converter and outputs the pixel data in response to control signals of the timing controller 44. Each column of the pixel array 30 may include two column lines for transferring pixel signals, and additional components can be used to process pixel signals transferred from the column lines.

The light source 10 may emit modulated light, which is modulated at a predetermined frequency, toward a scene captured by the image sensing device ISD, and the image sensing device ISD may sense modulated light (e.g., incident light) reflected from target objects 1 within the scene and generate depth information on each of the unit pixels. The distance between the image sensing device ISD and the target object 1 results in a time delay between the modulated light and the incident light. Such a time delay can be measured using a phase difference between a signal generated by the image sensing device ISD and the modulated light signal MLS for controlling the light source 10. An image processor (not illustrated) may generate a depth image containing depth information on each of the unit pixels by calculating a phase difference which appears in a signal outputted from the image sensing device ISD.

Figure 2:
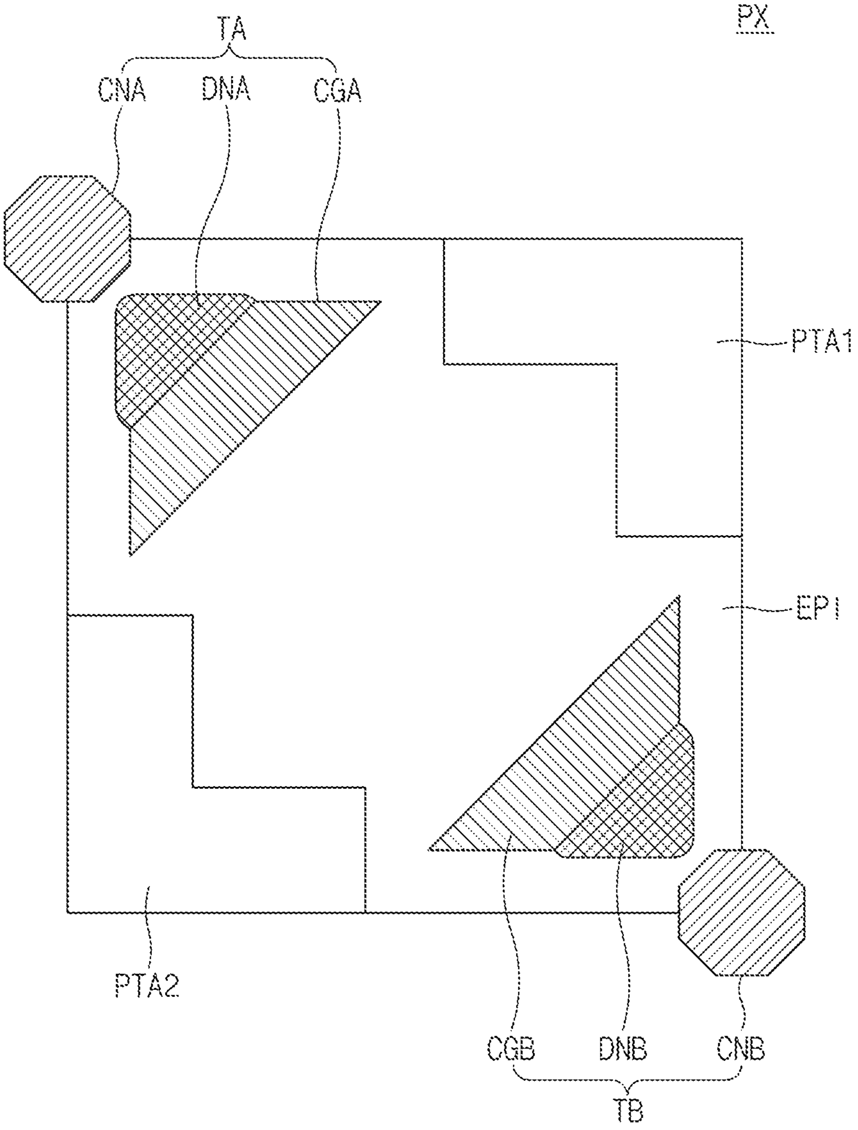
FIG. 2 is a diagram illustrating an example of a pixel illustrated in FIG. 1.

FIG. 2 is a diagram illustrating an example of a pixel illustrated in FIG. 1.

Referring to FIG. 2, a pixel PX may indicate a unit pixel included in the pixel array 30 of FIG. 1. The pixel PX may include a first tap TA, a second tap TB, a first pixel transistor area PTA1, a second pixel transistor area PTA2 and an epitaxial area EPI. In some implementations, each pixel PX includes two taps TA and TB. In other implementations, each pixel PX may include three or more taps. In one example, the plurality of taps may receive the same or different types of demodulation control signals or receive demodulation control signals at the same timing or different timings. In some implementations, each of the taps may be configured to receive or output electrical signals. In one example, each tap may be an electrical contact tap.

FIG. 2 illustrates that the first and second taps TA and TB are arranged in a diagonal direction as an example. In another embodiment, the first and second taps TA and TB may be arranged in a horizontal direction (row direction) or vertical direction (column direction).

The first tap TA may include a first control node CNA, a first detection node DNA, and a first control gate CGA. In some implementations, the first control node CNA has an octagonal shape, and the first detection node DNA has a triangular shape, and the first control gate CGA has a trapezoidal shape, as illustrated in FIG. 2. In other implementations, the first control node CNA may have a symmetrical shape (e.g., circle) in top-to-bottom and side-to-side directions and diagonal directions. In one example, the first control node CNA is shared by four pixels forming a 2×2 matrix. The first detection node DNA may be disposed as close to the first control node CNA and the first control gate CGA as possible, while having as large an area as possible. The first detection node DNA disposed in such a shape may more easily capture signal carriers that migrate along the electric potential difference or potential gradient formed by the first control node CNA and the first control gate CGA.

In an implementation where the pixel PX may have a plurality of sides and a plurality of angles, the first control node CNA may be disposed at a first vertex of the pixel PX or disposed to overlap the first vertex. In some implementations, one pixel may be formed in a rectangular shape having first to fourth vertices, and around the center of the pixel, a vertex located at the left top is defined as the first vertex, a vertex located at the right top is defined as the second vertex, a vertex located at the left bottom is defined as the third vertex, and a vertex located at the right bottom is defined as the fourth vertex. The first and fourth vertices may face each other in a first diagonal direction, which connects the first and fourth vertices, and the second and third vertices may face each other in a second diagonal direction, which connects the second and third vertices and is different from the first diagonal direction. The first and second diagonal directions may be defined as diagonal directions of the pixel PX.

The first detection node DNA may be disposed closer to the center of the pixel PX than the first control node CNA in the first diagonal direction, and spaced apart by a predetermined distance from the first control node CNA. Unlike the configuration illustrated in FIG. 2, the first control node CNA and the first detection node DNA may be disposed to abut on each other, and physically isolated from each other only by a junction isolation formed through a counter doping. At least a part of the first detection node DNA may overlap or abut on the first control gate CGA.

The first control gate CGA may be disposed closer to the center of the pixel PX than the first detection node DNA in the first diagonal direction, and overlap or abut on the first detection node DNA. The first control gate CGA may have a trapezoidal shape which includes a top side abutting on the first detection node DNA and a bottom side close to the pixel PX. Such a trapezoidal shape may form an electric potential difference or potential gradient across a wider area.

The first control node CNA, the first detection node DNA and the first control gate CGA may be sequentially arranged in the first diagonal direction, the first control node CNA may be disposed on one side of the first detection node DNA, and the first control gate CGA may be disposed on the other side of the first detection node DNA. The first detection node DNA may be disposed between the first control node CNA and the first control gate CGA.

The second tap TB may include a second control node CNB, a second detection node DNB, and a second control gate CGB. The second tap TB and the first tap TA may be disposed symmetrically with respect to the center of the pixel PX. In particular, the second control node CNB may be disposed at the fourth vertex of the pixel PX or disposed to overlap the fourth vertex.

In some implementations, the structures of the second control node CNB, the second detection node DNB and the second control gate CGB may be similar or identical to those of the first control node CNA, the first detection node DNA and the first control gate CGA, respectively.

The first and second control nodes CNA and CNB may be areas doped with a first conductive type impurity (e.g., P-type impurity), and the first and second detection nodes DNA and DNB may be areas doped with a second conductive type impurity (e.g., N-type impurity).

The first and second control gates CGA and CGB may be disposed in a planar shape on one surface (e.g., front side) of a substrate or may be formed in (or inserted into) the substrate from one surface (e.g., front side) of the substrate and disposed in a recess shape, and each include a gate dielectric layer for electrical isolation between the substrate and a gate electrode and the gate electrode for receiving a demodulation control signal. For example, the gate dielectric layer may include one or more of silicon oxynitride ($Si_xO_yN_z$), silicon oxide ($Si_xO_y$) and silicon nitride ($Si_xN_y$) where x, y and z are natural numbers, and the gate electrode may include one or more of polysilicon and metal.

The first pixel transistor area PTA1 may include pixel transistors (TX_A, RX_A, FDX_A, DX_A and SX_A of FIG. 3) for processing photocharges captured by the first tap TA. The second s pixel transistor area PTA2 may include pixel transistors (TX_B, RX_B, FDX_B, DX_B and SX_B of FIG. 3) for processing photocharges captured by the second tap TB. In another embodiment, the first pixel transistor area PTA1 may include pixel transistors related to the second tap TB, and the second pixel transistor area PTA2 may include pixel transistors related to the first tap TA.

The first pixel transistor area PTA1 may have a "L" shape that extends toward the first and fourth vertices while abutting on the second vertex of the pixel PX. The second pixel transistor area PTA2 may have an "L" shape that extends toward the first and fourth vertices while abutting on the third vertex of the pixel PX. In an embodiment, the pixel transistors included in the first and second pixel transistor areas PTA1 and PTA2 may be arranged in a line along the boundary between the pixels adjacent to each other. However, the scope of the present disclosure is not limited thereto.

Each of the transistors included in the first and second pixel transistor areas PTA1 and PTA2 may include a gate configured as a gate electrode which is disposed on a dielectric layer formed on one surface of the substrate, a source and a drain include impurity materials and are disposed on both sides of the gate electrode in the substrate, and a channel area corresponding to a lower area of the gate electrode in the substrate. The source and drain may be surrounded by a well area doped with a predetermined concentration of P-type impurities, and the well area may extend to the lower area of the gate electrode and thus form the body of each pixel transistor. Each of the first and second pixel transistor areas PTA1 and PTA2 may further include a terminal for supplying a body voltage (e.g., ground voltage) to the well area, for example, a high concentration doping area abutting on the well area.

In an embodiment, the substrate may indicate a substrate in which an epitaxial layer is grown, and the epitaxial area EPI may be defined as the other area except the first and second pixel transistor areas PTA1 and PTA2 and the components formed in the substrate among the components of the first and second taps TA and TB of the pixel PX. For example, the epitaxial area EPI may indicate an n-type or p-type epitaxial layer. A pixel region may be defined as a region that includes components located in the substrate among components of the corresponding pixel. In the present disclosure, for convenience of description, the pixel and the pixel region may be used interchangeably.

Figure 3:
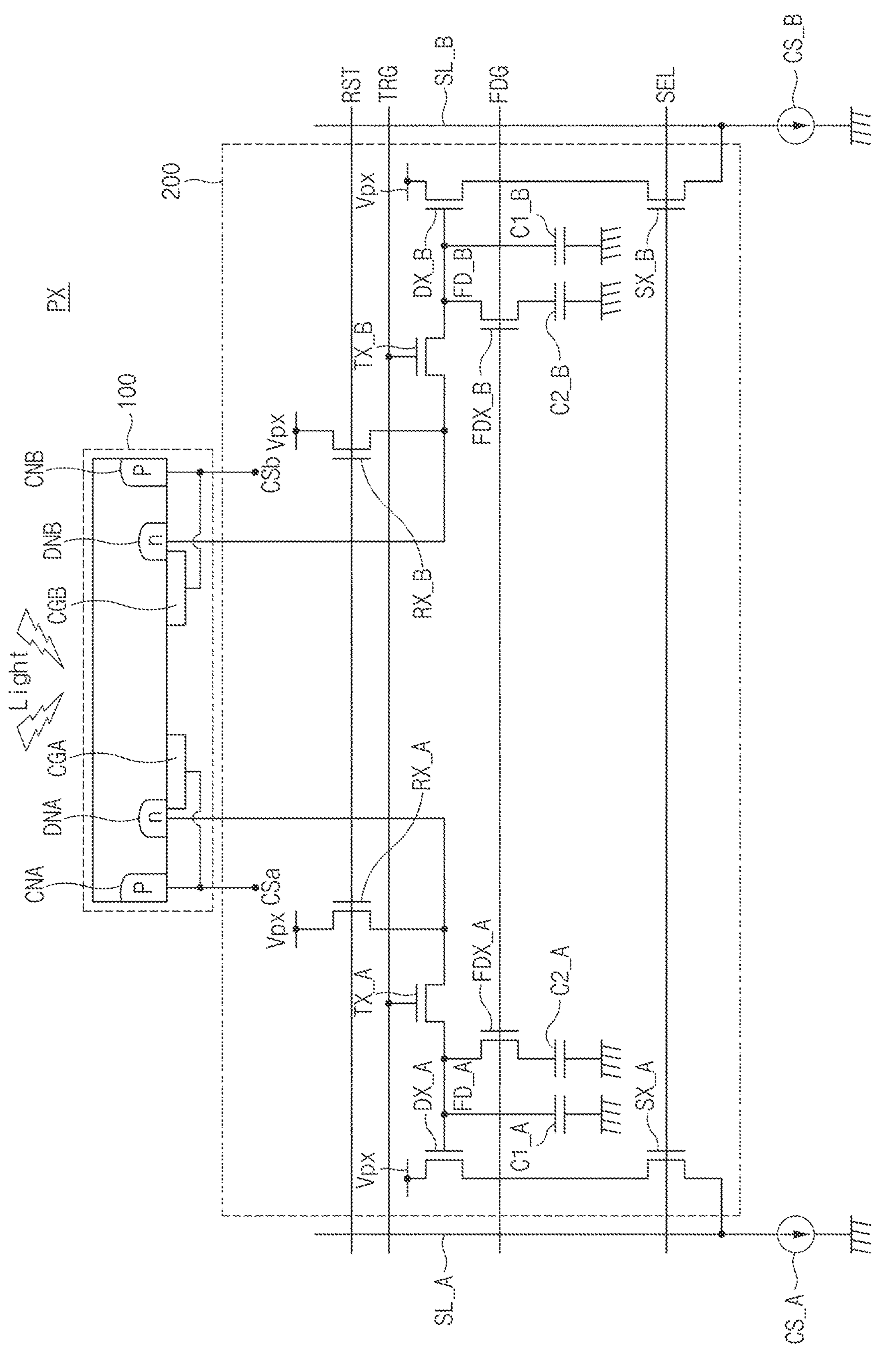
FIG. 3 is a diagram illustrating an operation of the pixel illustrated in FIG. 2.

FIG. 3 is a diagram illustrating an operation of the pixel illustrated in FIG. 2.

Referring to FIG. 3, the pixel PX may roughly include a photoelectric conversion area 100 and a circuit area 200.

The photoelectric conversion area 100 corresponds to a cross-sectional area obtained by cutting the pixel PX along a cutting line passing through the first and second taps TA and TB in FIG. 2. FIG. 3 briefly illustrates that the photoelectric conversion area 100 includes only components to directly perform a photoelectric conversion operation, among the components of a first pixel PX1.

The photoelectric conversion area 100 may include the first and second control nodes CNA and CNB, the first and second detection nodes DNA and DNB and the first and second control gates CGA and CGB.

The first and second control nodes CNA and CNB and the first and second detection nodes DNA and DNB may be formed in the semiconductor substrate, and the first and second control gates CGA and CGB may be formed on the semiconductor substrate. In another embodiment, the first and second control gates CGA and CGB may be partially inserted in a recess formed on the semiconductor substrate, unlike the structure illustrated in FIG. 3.

The first control node CNA and the first control gate CGA and the second control node CNB and the second control gate CGB may receive first and second demodulation control signals CSa and CSb, respectively, from the demodulation driver 42. The electric potential difference between the first and second demodulation control signals CSa and CSb generates an electric potential difference or potential gradient to control a flow of signal carriers generated in the substrate by incident light. When the voltage of the first demodulation control signal CSa is higher than the voltage of the second demodulation control signal CSb, the electric potential difference or potential gradient increases from the second tap TB toward the first tap TA. When the voltage of the first demodulation control signal CSa is lower than the voltage of the second demodulation control signal CSb, the electric potential difference or potential gradient increases from the first tap TA toward the second tap TB. The signal carriers generated in the substrate may migrate from a low voltage or potential area to a high potential area along the electric potential difference or potential gradient.

Each of the first and second detection nodes DNA and DNB may perform a function of capturing and accumulating signal carriers that migrate along the electric potential difference or potential gradient in the substrate.

In an embodiment, the photocharge capturing operation of the photoelectric conversion area 100 may be performed over first and second periods, which are sequential time periods.

In the first period, the light incident into the pixel PX may be photoelectrically converted according to the photoelectric effect, and generate an electron-hole pair corresponding to the intensity of the incident light. In some implementations, electrons generated in response to the intensity of the incident light may indicate photocharges. Here, the demodulation driver 42 may apply the first demodulation control signal CSa to the first control node CNA and the first control gate CGA, and apply the second demodulation control signal CSb to the second control node CNB and the second control gate CGB. In the first period, the voltage of the first demodulation s control signal CSa may be higher than that of the second demodulation control signal CSb. Here, the voltage of the first demodulation control signal CSa may be defined as an active voltage, and the voltage of the second demodulation control signal CSb may be defined as an inactive voltage. For example, the voltage of the first demodulation control signal CSa may be 1.2 V, and the voltage of the second demodulation control signal CSb may be 0 V.

The electric potential difference between the voltage of the first demodulation control signal CSa and the voltage of the second demodulation control signal CSb may generate an electric field between the first and second taps TA and TB, thereby forming an electric potential difference or potential gradient that increases from the second tap TB toward the first tap TA. That is, electrons within the substrate migrate toward the first tap TA.

In response to the luminous intensity of incident light, electrons may be generated in the substrate. The generated electrons may be migrated toward the first tap TA, and captured by the first detection node DNA.

In the second period following the first period, incident light incident into the pixel PX may be photoelectrically converted according to the photoelectric effect, and generate an electron-hole pair corresponding to the intensity of the incident light. Here, the demodulation driver 42 may apply the first demodulation control signal CSa to the first control node CNA, and apply the second s demodulation control signal CSb to the second control node CNB. In the second period, the voltage of the first demodulation control signal CSa may be lower than that of the second demodulation control signal CSb. Here, the voltage of the first demodulation control signal CSa may be defined as an inactive voltage, and the voltage of the second demodulation control signal CSb may be defined as an active voltage. For example, the voltage of the first demodulation control signal CSa may be 0 V, and the voltage of the second demodulation control signal CSb may be 1.2 V.

The electric potential difference between the voltage of the first demodulation control signal CSa and the voltage of the second demodulation control signal CSb may generate an electric field between the first and second taps TA and TB, thereby forming an electric potential difference or potential gradient that increases from the first tap TA toward the second tap TB. That is, the electrons within the substrate migrate toward the second tap TB.

In response to the luminous intensity of incident light, electrons may be generated in the substrate. The generated electrons may be migrated toward the second tap TB, and captured by the second detection node DNB.

In an embodiment, the sequence of the first and second periods may be changed.

FIG. 3 show that the pixel PX operates according to a 2-phase demodulation method based on the first and second demodulation control signals CSa and CSb which are exactly out of phase or have phase differences of 0 and 180 degrees from modulated light. However, the scope of the present disclosure is not limited thereto. For example, as the first demodulation control signal CSa is controlled to sequentially have phase differences of 0 and 90 degrees from the modulated light and simultaneously the second demodulation control signal CSb is controlled to sequentially have phase differences of 180 and 270 degrees from the modulated light, the pixel PX may operate according to a 4-phase demodulation method.

The circuit area 200 may include a plurality of elements for converting the photocharges, captured by the first and second detection nodes DNA and DNB, into electric signals by processing the photocharges. The circuit area 200 may include elements (e.g., transistors) disposed in the first and second pixel transistor areas PTA1 and PTA2 and interconnects for electrically coupling the elements in the pixel PX of FIG. 2 to each other. In some implementations, the circuit area 200 will be described with reference to a circuit diagram illustrated in FIG. 3, for convenience of description. Control signals RST, TRG, FDG and SEL applied to the plurality of elements may be supplied from the row driver 41. A pixel voltage Vpx may be a supply voltage.

First, the elements for processing the photocharges captured by the first detection node DNA will be described. The circuit area 200 may include a reset transistor RX_A, a transmission transistor TX_A, a first capacitor C1_A, a second capacitor C2_A, a floating diffusion transistor FDX_A, a drive transistor DX_A and a selection transistor SX_A.

The reset transistor RX_A may be activated in response to a logic high level of a reset signal RST applied to a gate electrode thereof, and reset the voltages at a floating diffusion node FD_A and the first detection node DNA to a predetermined level (e.g., the pixel voltage Vpx). When the reset transistor RX_A is activated, the transmission transistor TX_A may be simultaneously activated to reset the floating diffusion node FD_A.

The transmission transistor TX_A may be activated in response to a logic high level of a transmission signal TRG applied to a gate electrode thereof, and transmit charges accumulated in the first detection node DNA to the floating diffusion node FD_A.

The first capacitor C1_A may be coupled to the floating diffusion node FD_A, and provide a predetermined capacitance.

The second capacitor C2_A may be selectively coupled to the floating diffusion node FD_A according to the operation of the floating diffusion transistor FDX_A, and provide an additional predetermined capacitance.

Each of the first and second capacitors C1_A and C2_A may be configured as one or more of an MIM (Metal-Insulator-Metal) capacitor, MIP (Metal-Insulator-Polysilicon) capacitor, MOS (Metal-Oxide-Semiconductor) capacitor and a junction capacitor.

The floating diffusion transistor FDX_A may be activated in response to a logic high level of a floating diffusion signal FDG applied to a gate electrode thereof, and couple the second capacitor C2_A to the floating diffusion node FD_A.

Under a high luminance condition in which the luminous intensity of incident light is relatively high, the row driver 41 may activate the floating diffusion transistor FDX_A to couple the floating diffusion node FD_A to the second capacitor C2_A. Thus, under such a high luminance condition, the floating diffusion node FD_A can accumulate more photocharges therein, securing a high dynamic range.

Under a low luminance condition in which the luminous intensity of incident light is relatively low, the row driver 41 may inactivate the floating diffusion transistor FDX_A to isolate the floating diffusion node FD_A and the second capacitor C2_A from each other.

In another embodiment, the floating diffusion transistor FDX_A and the second capacitor C2_A may be omitted.

The drive transistor DX_A may constitute a source follower circuit with a load MOS of a constant current source circuit CS_A coupled to one end of a vertical signal line SL_A, as a drain electrode thereof is coupled to the pixel voltage Vpx and a source electrode thereof is coupled to the vertical signal line SL_A through the selection transistor SX_A. That is, the drive transistor DX_A may output a current, corresponding to the voltage at the floating diffusion node FD_A coupled to a gate electrode thereof, to the vertical signal line SL_A through the selection transistor SX_A.

The selection transistor SX_A may be activated in response to a logic high level of a selection signal SEL applied to a gate electrode thereof, and output a pixel signal, outputted from the drive transistor DX_A, to the vertical signal line SL_A.

In order to process the photocharge captured by the second detection node DNB, the circuit area 200 may include a reset transistor RX_B, a transmission transistor TX_B, a first capacitor C1_B, a second capacitor C2_B, a floating diffusion transistor FDX_B, a drive transistor DX_B and a selection transistor SX_B. In some implementations, the elements for processing the photocharges captured by the second detection node DNB are configured and operated in the same or similar manner as the above-described elements for processing the photocharges captured by the first detection node DNA except operation timings The pixel signals outputted to the respective vertical signal lines SL_A and SL_B from the circuit area 200 may be converted into image data through noise reduction and analog-digital conversion by the readout circuit 45.

FIG. 3 illustrates that each of the reset signal RST, the transmission signal TRG, the floating diffusion signal FDG and the selection signal SEL is supplied through one signal. However, each of the reset signal RST, the transmission signal TRG, the floating diffusion signal FDG and the selection signal SEL may be supplied through a plurality of signal lines (for example, two signal lines) such that the elements for processing the photocharges captured by the first detection node DNA and the elements for processing the photocharges captured by the second detection node DNB are operated at different timings.

The image processor (not illustrated) may calculate a phase difference by performing an operation on the image data acquired from the photocharges captured by the first detection node DNA and the image data acquired from the photocharges captured by the second detection node DNB, calculate depth information that indicates the distance to the target object 1 based on a phase difference corresponding to each of the pixels, and generate a depth image including the depth information corresponding to each of the pixels.

Figure 4:
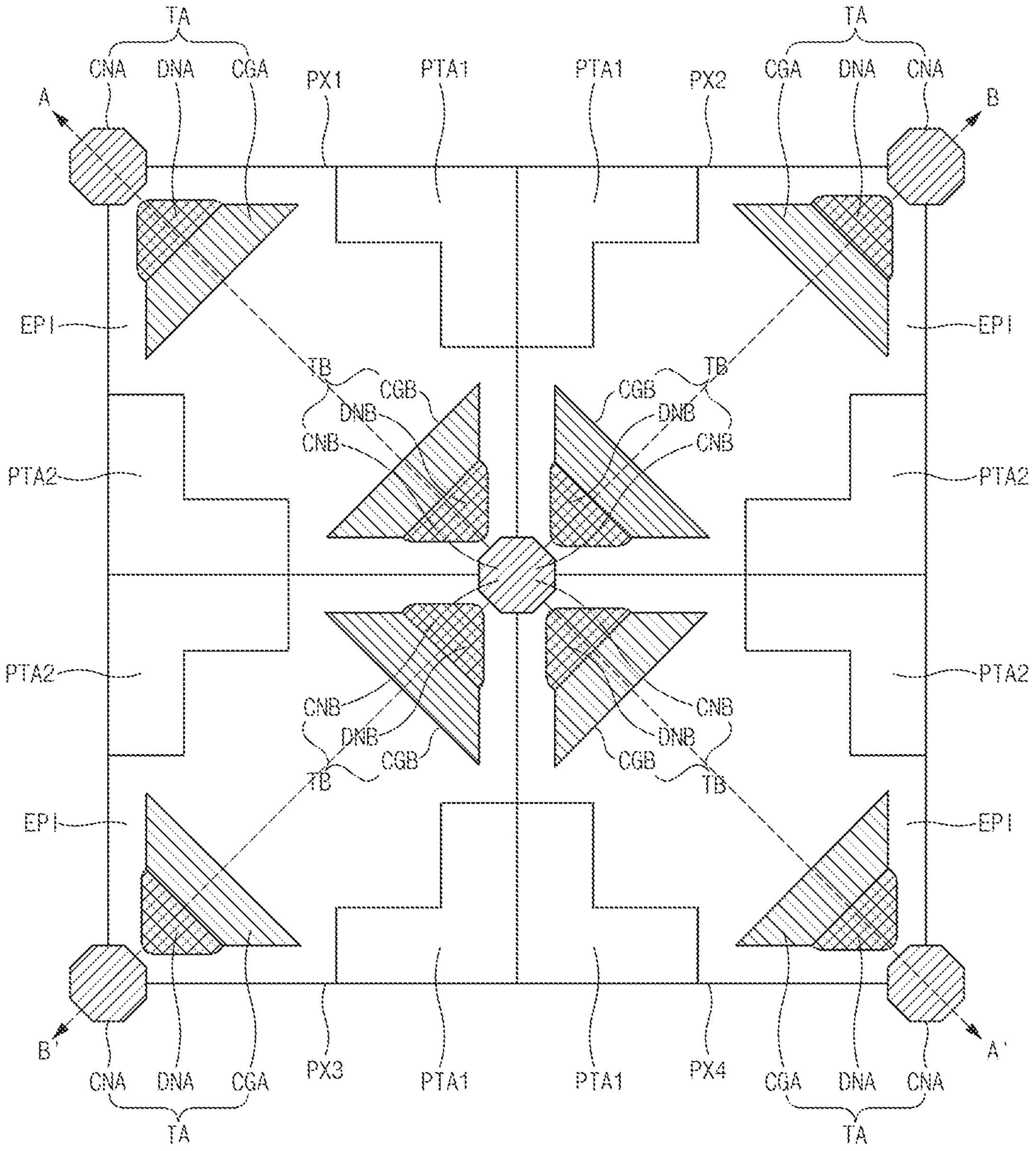
FIG. 4 is a diagram illustrating a part of a pixel array including the pixel of FIG. 2.

FIG. 4 is a diagram illustrating a part of a pixel array including the pixel of FIG. 2.

FIG. 4 illustrates an example in which the pixel PX of FIG. 2 and pixels corresponding to the pixel PX are arranged. FIG. 4 illustrates first to fourth pixels PX1 to PX4 arranged in a 2×2 matrix, and each of the first to fourth pixels PX1 to PX4 may be any one of the pixels PX illustrated in FIG. 1. For convenience of description, four pixels PX1 to PX4 will be taken as an example. Other pixels included in the pixel array 30 may have the same or similar structure and operation.

The first pixel PX1 may have the same structure as the pixel PX illustrated in FIG. 2, the second pixel PX2 and the first pixel PX1 may be symmetrical with respect to the boundary therebetween, and the third pixel PX3 and the first pixel PX1 may be symmetrical with respect to the boundary therebetween. Furthermore, the fourth pixel PX4 and the first pixel PX1 may be symmetrical with respect to the fourth vertex of the first pixel PX1 or a structure obtained by rotating the first pixel PX1 around the fourth vertex by 180 degrees.

In each of the pixels, the first and second control nodes CNA and CNB may be respectively disposed at vertices facing each other in the first or second diagonal direction. Thus, the first to fourth pixels PX1 to PX4, which are adjacent to each other and form a 2×2 matrix, may share the control node with one another.

The pixels arranged in a 2×2 matrix may share the control node, and each independently include the detection node and the control gate. As the pixels arranged in the 2×2 matrix do not each independently include the control node but share the control node, the distance between the control nodes within a random pixel may be maximized. A hall current, which may contribute to a flow of signal carriers, may flow between the control node to which the active voltage is applied and the control node to which the inactive voltage is applied. When an excessive hall current flows, the power consumption of the image sensing device ISD may be significantly s increased. As described above, the arrangement of FIG. 4 may maximize the distance between the control nodes within a random pixel, such that the resistance between the control nodes may be maximized. Thus, the magnitude of the hall current may be reduced.

As the pixels arranged in the 2×2 matrix share the control node, the number of control nodes required by the pixel array 30 is decreased to ¼ in comparison to the case in which the pixels each independently include the control node. This configuration can significantly reduce the number of control nodes that need to receive voltages from the control circuits 41 and 42, reducing the power consumption of the image sensing device. Furthermore, the decrease in the number of the control nodes may help achieve the miniaturization needed in many applications.

Figure 5:
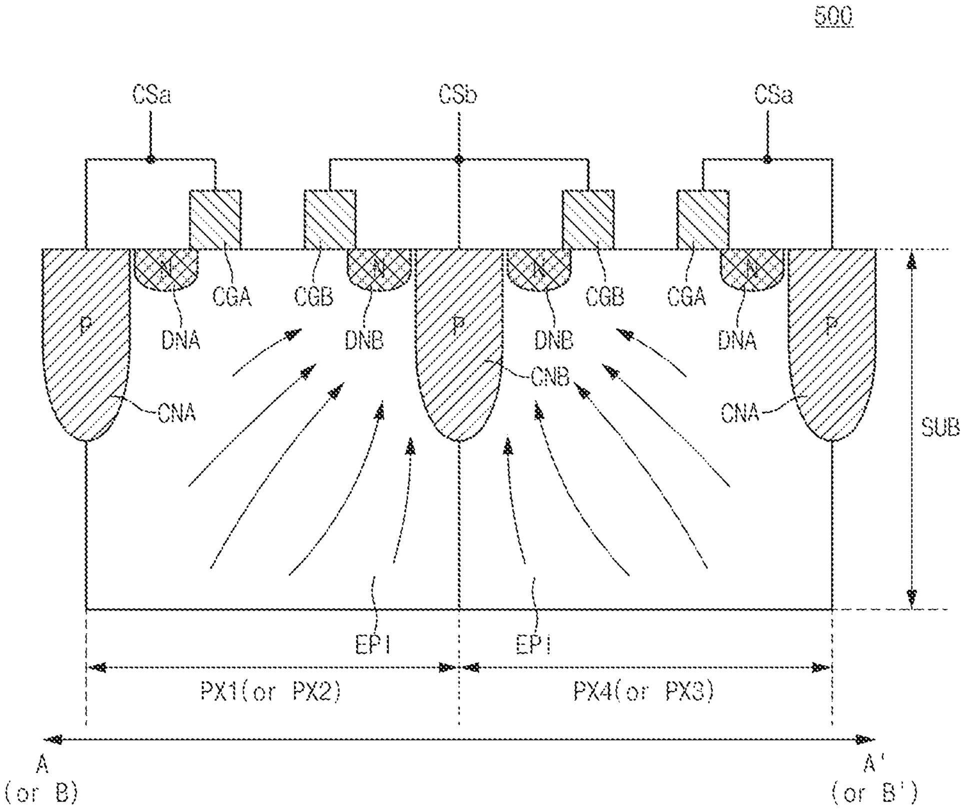
FIG. 5 is a diagram illustrating an example of a cross-section taken along line A-A' or line B-B' of FIG. 4.

FIG. 5 is a diagram illustrating an example of a cross-section taken along line A-A' or line B-B' of FIG. 4.

FIG. 5 illustrates a cross-section 500 obtained by cutting the pixels PX1 to PX4 along line A-A' or line B-B'. The cross-section of FIG. 5 obtained along line A-A' may correspond to the first and fourth pixels PX1 and PX4, and the cross-section of FIG. 5 obtained along line B-B' may correspond to the second and third pixels PX2 and PX3.

A substrate SUB may indicate the above-described semiconductor substrate in which an epitaxial layer is grown, and the epitaxial area EPI may be disposed in most areas of the substrate SUB. The substrate SUB may include top and bottom surfaces facing each other (surfaces facing away from each other and facing each other through the substrate). The top surface may indicate a front side, and the bottom surface may indicate a back side. The pixels are located in the substrate SUB to located their pixel components such as heavily doped P and N conductive regions or conductors for forming the control nodes, detection nodes and control gates at or near the top surface or front surface and are closer to the top surface or front surface than the bottom surface or back surface to collect the light-inducted charges to generate pixel signals for further processing. The image sensing device is oriented to receive incident light from the bottom or back surface. Reflected light from the target that is illuminated by the modulated light may be incident to the image sensing device through the back side of the substrate SUB. The incident light enters the substrate SUB from the back side and interacts with the photosensing region in the substrate SUB and this interaction converts the light into photocharges (e.g., electrons) in the epitaxial area EPI, and the photocharges may migrate along an electric potential difference or potential gradient formed in the substrate SUB by the first and second demodulation control signals CSa and CSb.

The first and second control nodes CNA and CNB and the first and second detection nodes DNA and DNB may be formed in the substrate SUB so as to have a predetermined depth from the front side of the substrate SUB. As illustrated in FIG. 5, the first and second control nodes CNA and CNB may have a larger depth than the first and second detection nodes DNA and DNB. Since it is difficult for photocharges to migrate through the first and second control nodes CNA and CNB, the first and second control nodes CNA and CNB are each formed to a relatively large depth, thereby preventing cross-talk between the pixels resulting from noise generated as photocharges generated in any one pixel (e.g., PX1) are migrated to another adjacent pixel (e.g., PX4) and then captured.

The first and second control gates CGA and CGB may be disposed on the front side of the substrate SUB so as to be located outside the substrate SUB.

The same first demodulation control signal CSa may be applied to the first control node CNA and the first control gate CGA, and the same second demodulation control signal CSb may be applied to the second control node CNB and the second control gate CGB. To this end, the first control gate CGA (or the second control gate CGB) is electrically connected to the first control node CNA (or the second control node CNB) through a conductive structure disposed outside the substrate. In another embodiment, different voltages may be applied to the control node and the control gate. For example, a voltage (e.g., 2.8 V) applied to the control gate may be higher than a voltage (e.g., 1.2 to 1.5 V) applied to the control node, such that the control gate can create an electric potential difference corresponding to the control node. However, it is desirable that the same voltages are applied to the control node and the control gate, in order to reduce the complexity of design and control. Therefore, the same voltages are applied to the control node and the control gate, and the thickness of the gate dielectric layer included in the control gate may be set to a relatively small value, such that the control gate can create an electric potential difference corresponding to the control node. For example, the thickness of the gate dielectric layer included in the first or second control gate CGA or CGB may be smaller than the thickness of the gate dielectric layer of the transistor included in the first or second pixel transistor area PTA1 or PTA2.

FIG. 5 simply illustrates migration paths of photocharges based on an electric potential difference or potential gradient, when the first demodulation control signal CSa has an inactive voltage and the second demodulation control signal CSb has an active voltage.

When it is assumed that the epitaxial area EPI includes an n-type impurity, the first and second control nodes CNA and CNB each including a p-type impurity may each form a PN junction with the epitaxial area EPI, and a depletion area (not illustrated) may be formed around each of the first and second control nodes CNA and CNB.

When the active voltage is applied to the second control node CNB and the inactive voltage is applied to the first control node CNA, the voltage of the depletion area adjacent to the second control node CNB momentarily rises to maintain the PN junction, and the depletion area adjacent to the first control node CNA has a relatively low voltage. Thus, photocharges generated in the substrate may be migrated to around the second control node CNB having a high voltage, and captured by the second detection node DNB.

Furthermore, when the active voltage is applied to the second control gate CGB and the inactive voltage is applied to the first control gate CGA, the voltage at an area adjacent to the bottom of the second control gate CGB rises, and the voltage at an area adjacent to the bottom of the first control gate CGA falls. Thus, photocharges generated in the substrate may be migrated to the area adjacent to the bottom of the second control gate CGB having a high voltage, and captured by the second detection node DNB.

That is, the pixel PX implemented based on some embodiments of the disclosed technology includes the diffusion type control structure, which uses the control node, and the gate type control structure, which uses the control gate, may be disposed together, maximizing the capturing performance for the photocharges.

Figure 6:
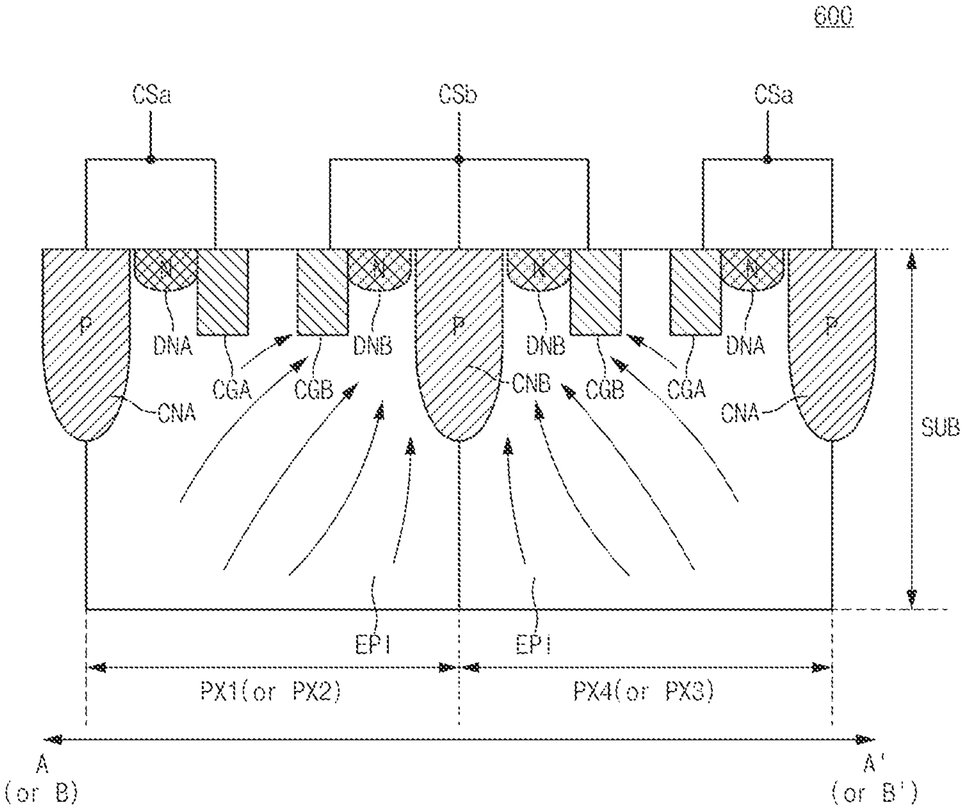
FIG. 6 is a diagram illustrating another example of the cross-section taken along line A-A' or line B-B' of FIG. 4.

FIG. 6 is a diagram illustrating another example of the cross-section taken along line A-A' or line B-B' of FIG. 4.

FIG. 6 illustrates a cross-section 600 obtained by cutting the pixels PX1 to PX4 along line A-A' or line B-B'. When the pixels are cut along line A-A', the cross-section of FIG. 6 may correspond to the first and fourth pixels PX1 and PX4, and when the pixels are cut along line B-B', the cross-section of FIG. 6 may correspond to the second and third pixels PX2 and PX3.

Since the cross-section 600 has substantially the same structure as the cross-section 500 of FIG. 5 except some differences from the cross-section 500 of FIG. 5, the following descriptions will be focused on the differences from the cross-section 500.

The first and second control gates CGA and CGB illustrated in FIG. 6 may be inserted to a predetermined depth from the front side of the substrate SUB, and thus located in the substrate SUB. The first and second control gates CGA and CGB may be disposed through a method of forming a trench through an etching process, forming a gate dielectric layer in the trench through a deposition process, and forming a gate electrode by gap-filling the trench with a conductive material.

As the first and second control gates CGA and CGB are formed in or inserted into the substrate SUB, the contact area between the first and second control gates CGA and CGB and the substrate SUB may be further increased, forming an electric field across a wider area. Therefore, although the first and second control gates CGA and CGB are formed in a narrow area when seen from the top, the first and second control gates CGA and CGB may create an electric potential difference that is similar to that of FIG. 5, further reducing the size of the pixel.

The first and second control gates CGA and CGB may have a smaller depth than the first and second control nodes CNA and CNB. That is because, when the first and second control gates CGA and CGB are formed to unnecessarily have a large depth, the first and second control gates CGA and CGB may disturb a flow of photocharges that migrate along an electric potential difference or potential gradient in the pixel, and thus degrade the photocharge capturing efficiency.

Figure 7A:
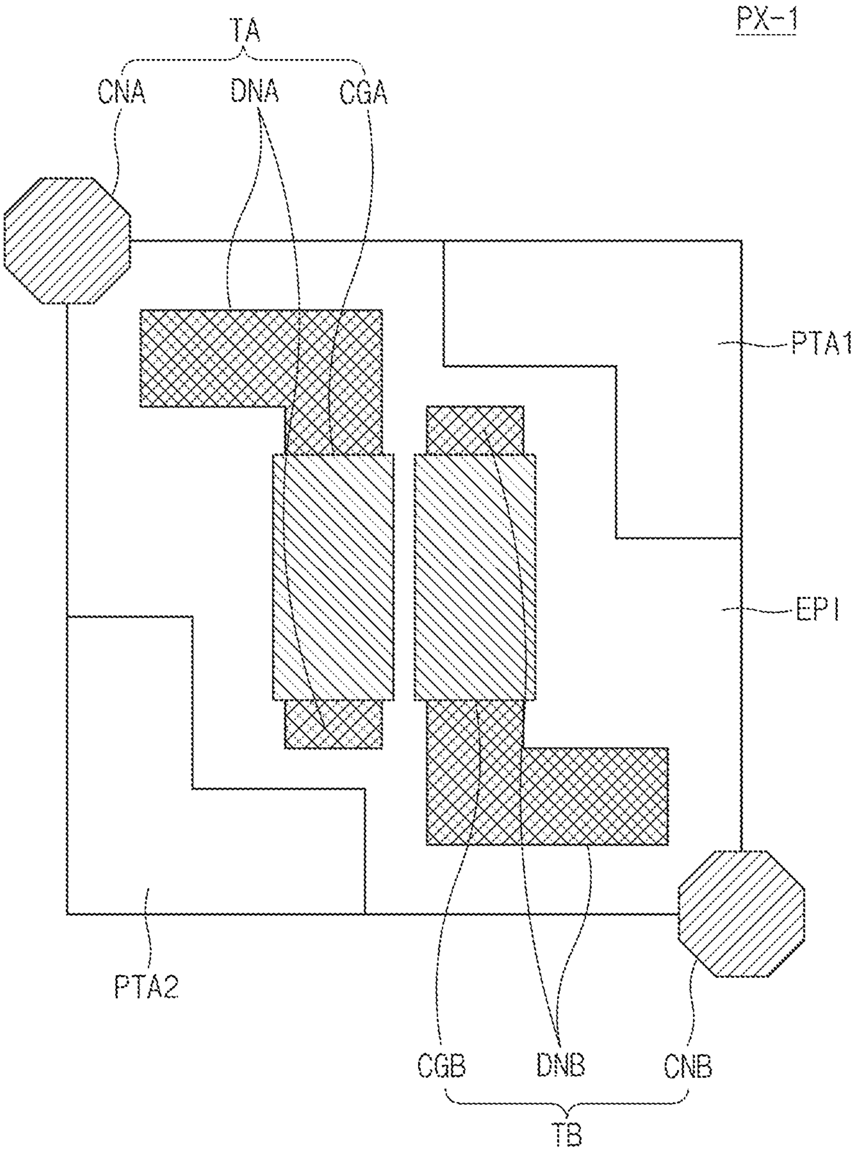
FIG. 7A is a diagram illustrating another example of the pixel illustrated in FIG. 2.

FIG. 7A is a diagram illustrating another example of the pixel illustrated in FIG. 2.

FIG. 7A illustrates a pixel PX-1 corresponding to an embodiment configured by modifying the structure of the pixel PX illustrated in FIG. 2. Since the pixel PX-1 is substantially the same as the pixel PX except some differences, the following descriptions will be focused on the differences.

The first and second control gates CGA and CGB may be disposed close to the center of the pixel PX-1. The first and second control gates CGA and CGB may each have a rectangular shape. As the first and second control gates CGA and CGB are disposed close to each other around the center of the pixel PX-1, a stronger electric field may be formed by the first and second control gates CGA and CGB.

The first detection node DNA may have a "L" shape including an area that extends toward the first control node CNA and an area of which at least a part overlaps the first control gate CGA. The second detection node DNB may have a "L" shape including an area that extends toward the second control node CNB and an area that at least partially overlaps the second control gate CGB. The first and second detection nodes having such a shape may more easily capture photocharges that migrate along an electric potential difference or potential gradient formed by the control nodes CNA and CNB and the control gates CGA and CGB.

Figure 7B:
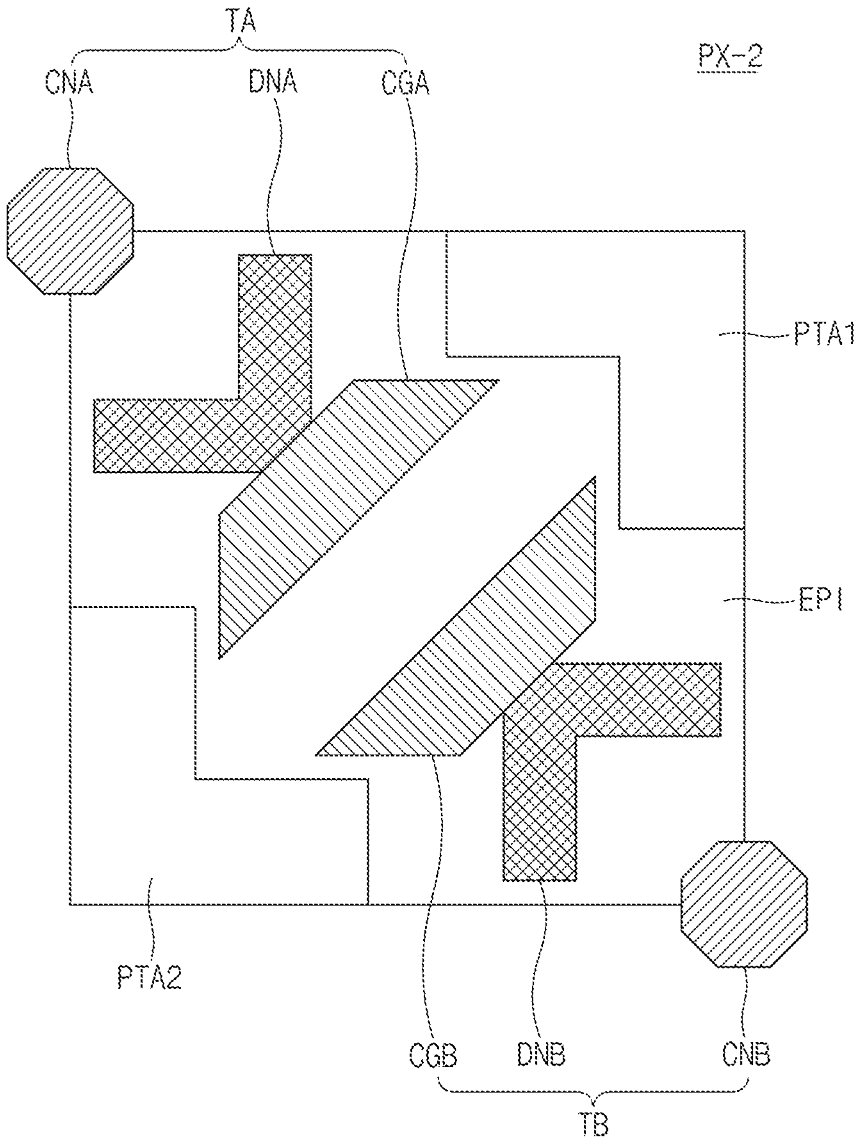
FIG. 7B is a diagram illustrating still another example of the pixel illustrated in FIG. 2.

FIG. 7B is a diagram illustrating still another example of the pixel illustrated in FIG. 2.

FIG. 7B illustrates a pixel PX-2 corresponding to an embodiment configured by modifying the structure of the pixel PX illustrated in FIG. 2. Since the pixel PX-2 is substantially the same as the pixel PX except some differences, the following descriptions will be focused on the differences.

The first and second control gates CGA and CGB may be disposed close to the center of the pixel PX-2, while having a trapezoidal shape like the structure of FIG. 2. Furthermore, as the first and second control gates CGA and CGB are disposed closer to the center of the pixel PX-2, the first and second control gates CGA and CGB may be disposed across a wider area, and thus a stronger electric field may be formed by the first and second control gates CGA and CGB.

The first detection node DNA may have a "L" shape including an area that extends toward the first control node CNA while surrounding a part of the first control node CNA, and at least a part of the first detection node DNA may overlap or abut on the first control gate CGA. Furthermore, the second detection node DNB may have a "L" shape including an area that extends toward the second control node CNB while surrounding a part of the second control node CNB, and at least a part of the second detection node DNB may overlap or abut on the second control gate CGB. The first and second detection nodes DNA and DNB having such a shape may more easily capture photocharges that migrate along an electric potential difference or potential gradient formed by the control nodes CNA and CNB and the control gates CGA and CGB.

Figure 8:
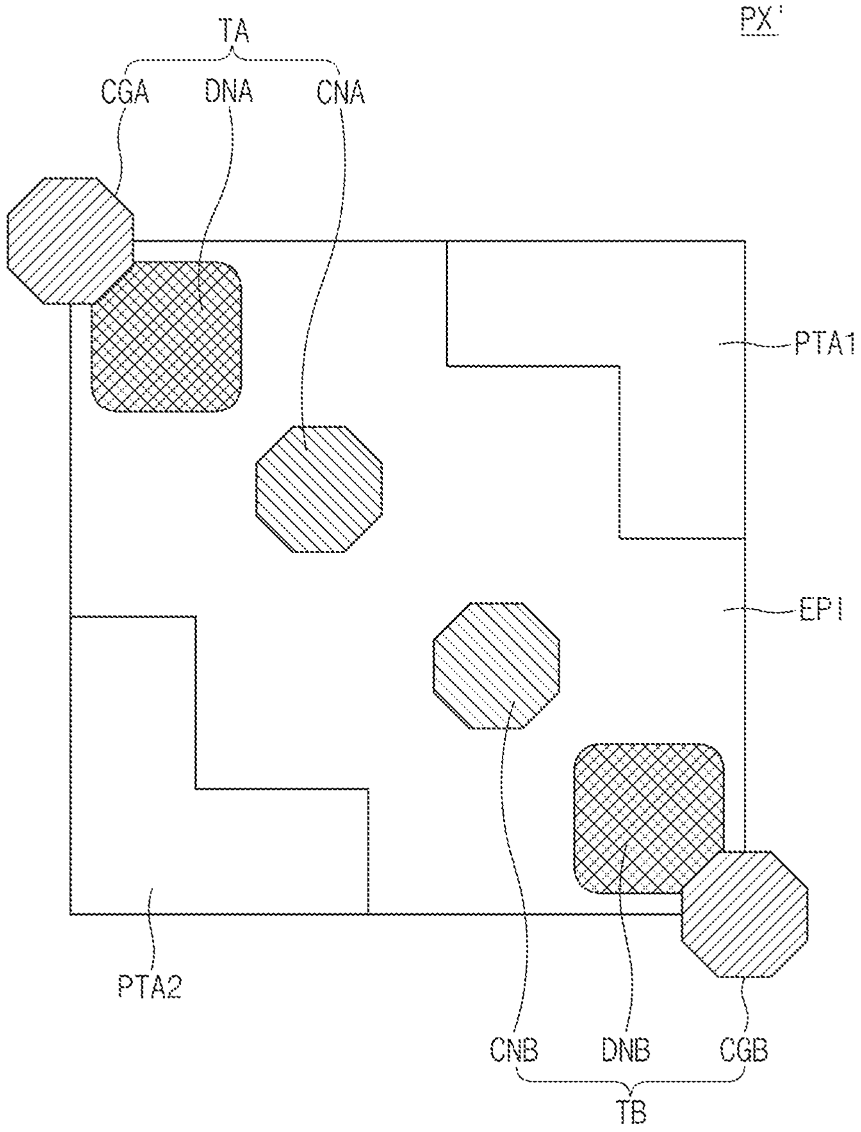
FIG. 8 is a diagram briefly illustrating another example of the pixel illustrated in FIG. 1.

FIG. 8 is a diagram briefly illustrating another example of the pixel illustrated in FIG. 1.

Referring to FIG. 8, a pixel PX' may include a first tap TA, a second tap TB, a first pixel transistor area PTA1, a second pixel transistor area PTA2 and an epitaxial area EPI. Since the pixel PX' is configured and operated in substantially the same manner as the pixel PX described with reference to FIGS. 2 and 3 except some differences, the following descriptions will be focused on the differences.

A first control node CNA and a first control gate CGA, which are included in the pixel PX', may be disposed in the opposite way to the first control node CNA and the first control gate CGA, which are included in the pixel PX. That is, the first control gate CGA may be disposed at a first vertex of the pixel PX' or disposed to overlap the first vertex. The first control node CNA may be disposed closer to the center of the pixel PX' than a first detection node DNA in a first diagonal direction, and spaced by a predetermined distance apart from the first detection node DNA.

The first detection node DNA may be disposed closer to the center of the pixel PX' than the first control gate CGA in the first diagonal direction, and disposed to overlap or abut on the first control gate CGA.

The first control gate CGA may have a symmetrical shape in top-to-bottom and side-to-side directions and diagonal directions (e.g., an octagonal or circular shape) like the first control node CNA, unlike the structure of FIG. 2. This is in order to form the same electric potential difference or potential gradient for four pixels sharing the first control gate CGA which is disposed at the first vertex of the pixel PX'.

The second tap TB of the pixel PX' may include a second control node CNB, a second detection node DNB, and a second control gate CGB. The second tap TB and the first tap TA may be disposed symmetrically with respect to the center of the pixel PX'. In particular, the second control gate CGB may be disposed at a fourth vertex of the pixel PX' or disposed to overlap the fourth vertex.

In some implementations, overall operations of the pixel PX' are performed in the same or similar manner as those of the pixel PX described with reference to FIG. 3.

Figure 9:
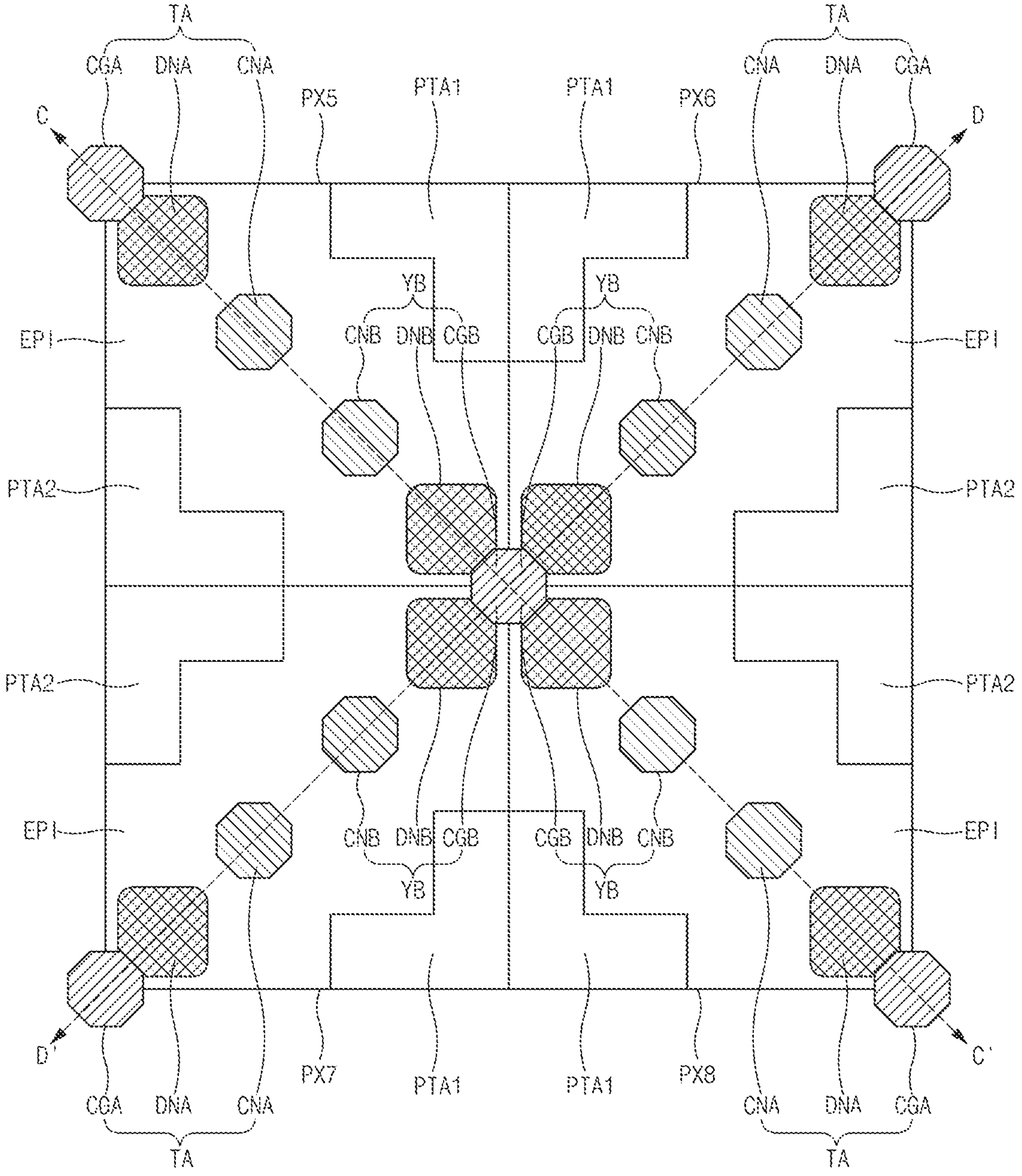
FIG. 9 is a diagram illustrating a part of a pixel array including the pixel of FIG. 8.

FIG. 9 is a diagram illustrating a part of a pixel array including the pixel of FIG. 8.

FIG. 9 illustrates an example in which the pixel PX' of FIG. 8 and pixels corresponding to the pixel PX' are arranged. FIG. 9 illustrates fifth to eighth pixels PX5 to PX8 arranged in a 2×2 matrix, and each of the fifth to eighth pixels PX5 to PX8 may be any one of the pixels PX' illustrated in FIG. 8. For convenience of description, four pixels PX5 to PX8 will be taken as an example for description. However, substantially the same structure and operation may be applied to other random pixels included in the pixel array 30.

The fifth pixel PX5 may have the same structure as the pixel PX' illustrated in FIG. 8, the sixth pixel PX6 and the fifth pixel PX5 may be symmetrical with respect to the boundary therebetween, and the seventh pixel PX7 and the fifth pixel PX5 may be symmetrical with respect to the boundary therebetween. Furthermore, the eighth pixel PX8 and the fifth pixel PX5 may be symmetrical with respect to the fourth vertex of the fifth pixel PX5 or a structure obtained by rotating the fifth pixel PX5 around the fourth vertex by 180 degrees.

In each of the pixels, the first and second control nodes CNA and CNB may be respectively disposed at vertices facing each other in the first or second diagonal direction. Thus, the fifth to eighth pixels PX5 to PX8, which are adjacent to each other and form a 2×2 matrix, may share the control gate with one another.

The pixels arranged in a 2×2 matrix may share the control gate, and each independently include the detection node and the control node.

As the pixels arranged in the 2×2 matrix share the control gate, the number of control gates required by the pixel array 30 is decreased to ¼ in comparison to the case in which the pixels each independently include the control gate. This configuration can significantly reduce the number of control nodes that need to receive voltages from the control circuits 41 and 42, reducing the power consumption of the image sensing device. Furthermore, the decrease in the number of the control gates may help achieve the miniaturization needed in many applications.

Figure 10:
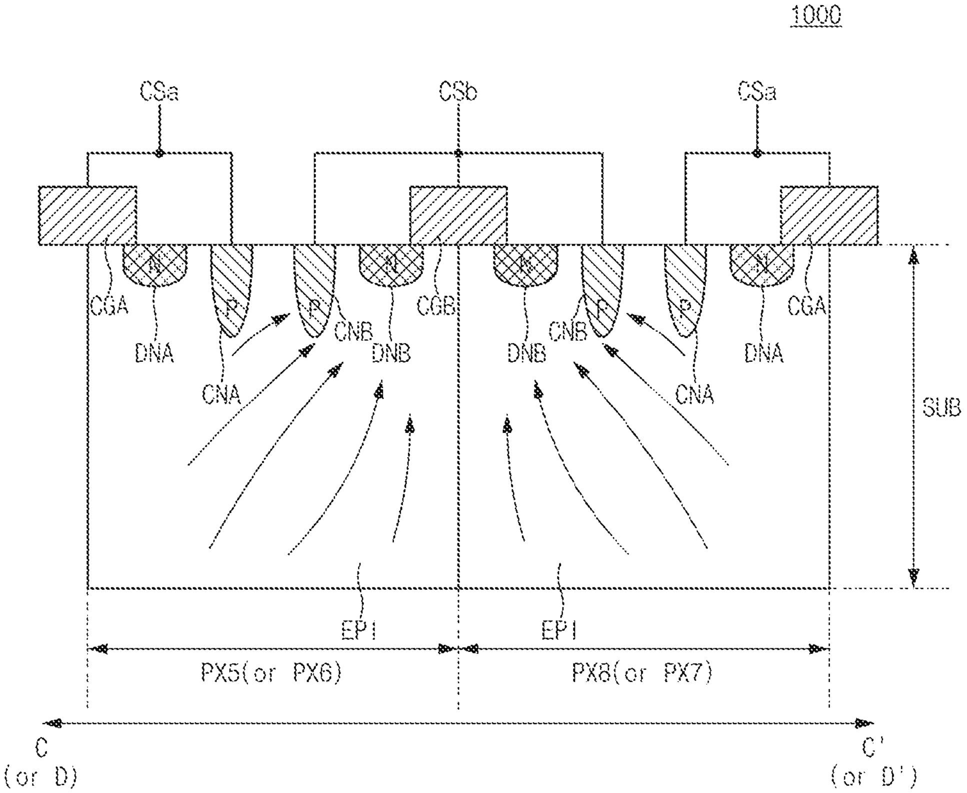
FIG. 10 is a diagram illustrating an example of a cross-section taken along line C-C' or line D-D' of FIG. 9.

FIG. 10 is a diagram illustrating an example of a cross-section taken along line C-C' or line D-D' of FIG. 9.

FIG. 10 illustrates a cross-section 1000 obtained by cutting the pixels PX5 to PX8 along line C-C' or line D-D'. The cross-section of FIG. 10 obtained along line C-C' may correspond to the fifth and eighth pixels PX5 and PX8, and the cross-section of FIG. 10 obtained along line D-D' may correspond to the sixth and seventh pixels PX6 and PX7.

Since the cross-section 1000 has substantially the same structure as the cross-section 500 of FIG. 5 except some differences from the cross-section 500 of FIG. 5, the following descriptions will be focused on the differences from the cross-section 500.

The first control node CNA and the first control gate CGA, which are included in the cross-section 1000, may be disposed in the opposite way to the first control node CNA and the first control gate CGA, which are included in the cross-section 500. Furthermore, the second control node CNB and the second control gate CGB, which are included in the cross-section 1000, may be disposed in the opposite way to the second control node CNB and the second control gate CGB, which are included in the cross-section 500.

The first and second control nodes CNA and CNB may have a larger depth than the first and second detection nodes DNA and DNB. However, the depth of the first and second control nodes CNA and CNB may be smaller than when the first and second control nodes CNA and CNB are disposed at the boundary between the pixels as in FIG. 5. If the first and second control nodes CNA and CNB are each formed to unnecessarily have a large depth, the first and second control nodes CNA and CNB may disturb a flow of photocharges that migrate along an electric potential difference or potential gradient in the pixel, and thus degrade the photocharge capturing efficiency.

Figure 11:
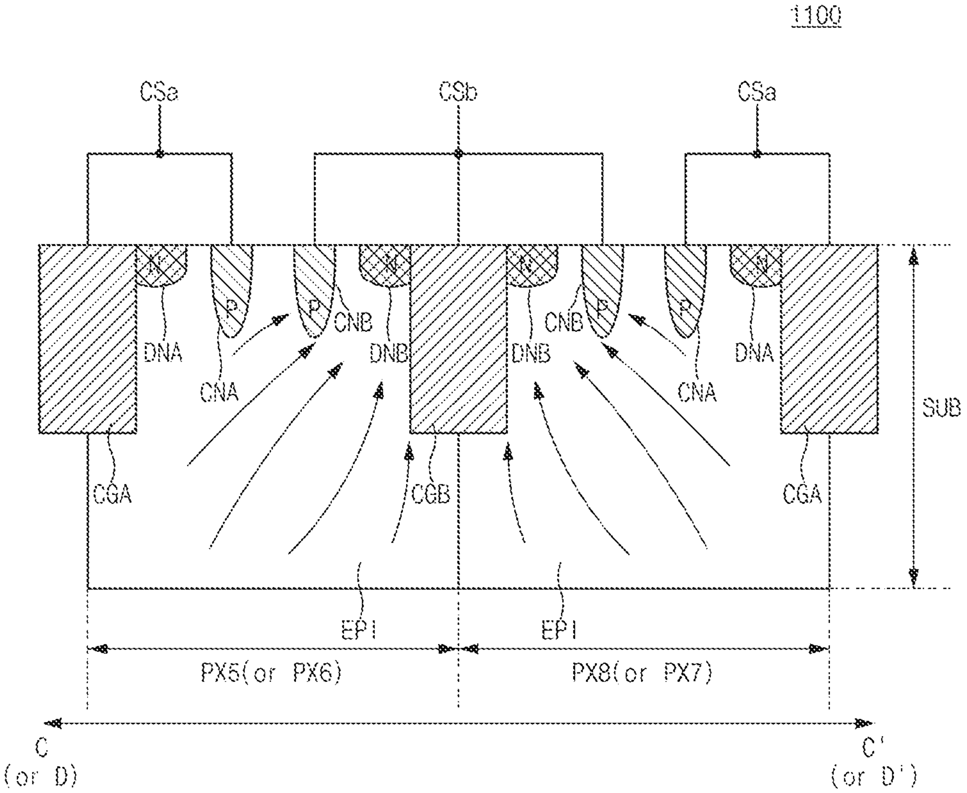
FIG. 11 is a diagram illustrating another example of the cross-section taken along line C-C' or line D-D' of FIG. 9.

FIG. 11 is a diagram illustrating another example of the cross-section taken along line C-C' or line D-D' of FIG. 9.

FIG. 11 illustrates a cross-section 1100 obtained by cutting the pixels PX5 to PX8 along line C-C' or line D-D'. The cross-section of FIG. 11 obtained along line C-C' may correspond to the fifth and eighth pixels PX5 and PX8, and the cross-section of FIG. 11 obtained along line D-D' may correspond to the sixth and seventh pixels PX6 and PX7.

Since the cross-section 1100 has substantially the same structure as the cross-section 1000 of FIG. 10 except some differences from the cross-section 1000, the following descriptions will be focused on the differences from the cross-section 1000.

The first and second control gates CGA and CGB illustrated in FIG. 11 may be inserted to a predetermined depth from the front side of the substrate SUB, and thus located in the substrate SUB.

As the first and second control gates CGA and CGB are inserted into the substrate SUB, the contact area between the first and second control gates CGA and CGB and the substrate SUB may be further increased, forming an electric field across a wider area. Therefore, although the first and second control gates CGA and CGB are formed in a narrow area when seen from the top, the first and second control gates CGA and CGB may create an electric potential difference that is similar to that of FIG. 10, further reducing the size of the pixel.

The first and second control gates CGA and CGB may have a larger depth than the first and second control nodes CNA and CNB. Since it is difficult for photocharges to migrate through the first and second control gates CGA and CGB, the first and second control gates CGA and CGB are each formed to a relatively large depth, thereby preventing cross-talk between the pixels resulting from noise generated as photocharges generated in any one pixel (e.g., PX5) are migrated to another adjacent pixel (e.g., PX8) and then captured.

Figure 12A:
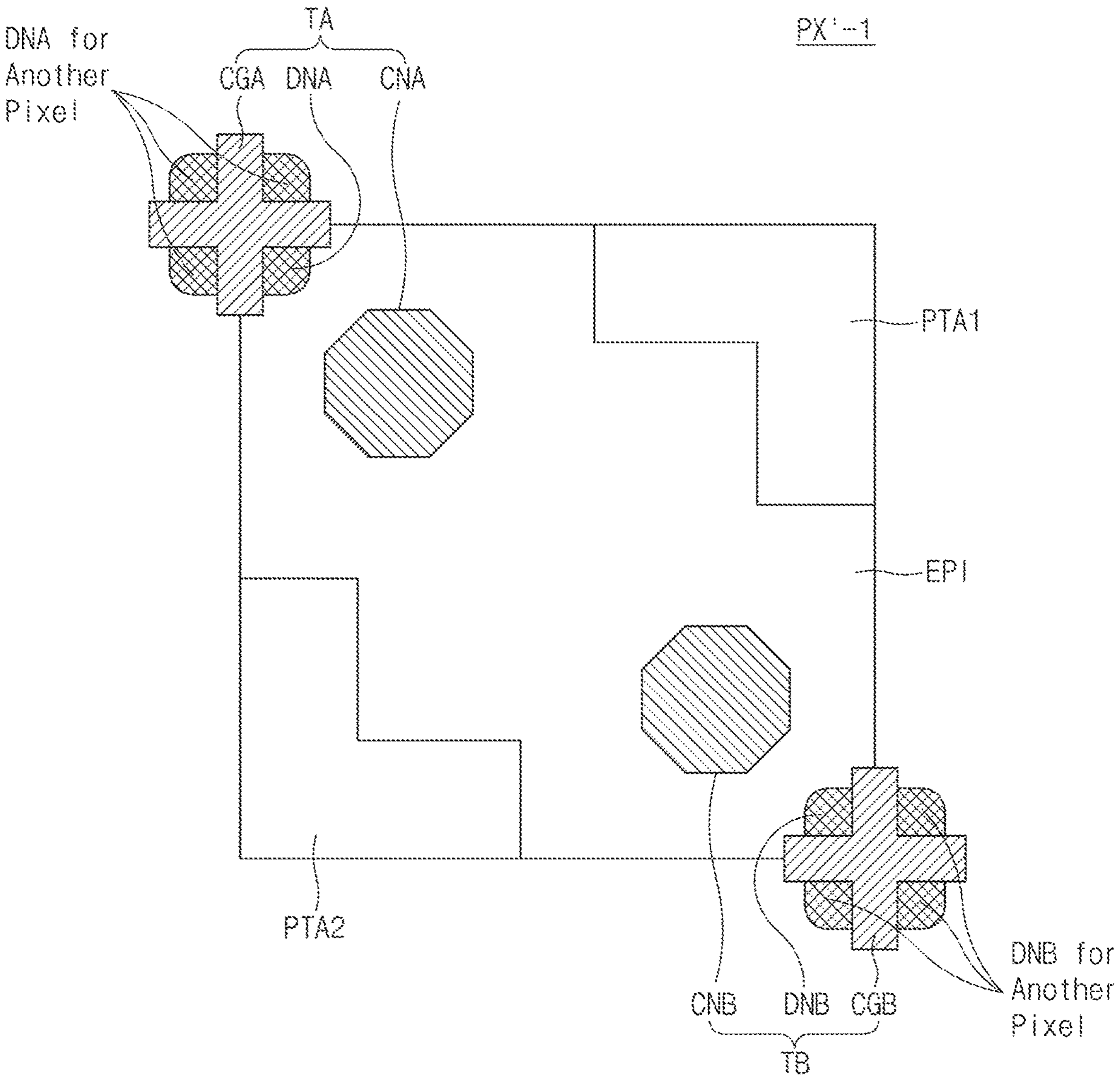
FIG. 12A is a diagram illustrating another example of the pixel illustrated in FIG. 8.

FIG. 12A is a diagram illustrating another example of the pixel illustrated in FIG. 8.

FIG. 12A illustrates a pixel PX'-1 corresponding to an embodiment configured by modifying the structure of the pixel PX' illustrated in FIG. 8. Since the pixel PX'-1 is substantially the same as the pixel PX' except some differences, the following descriptions will be focused on the differences.

The first control gate CGA may have a cross shape or coordinate axis shape including bars extended in the top-to-bottom and side-to-side directions around the first vertex of the pixel PX'-1. The first detection node DNA of the pixel PX'-1 may be disposed to fill a fourth quadrant of the coordinate axis shape of the first control gate CGA. Furthermore, the first detection nodes DNA of other pixels adjacent to the pixel PX'-1 may be disposed in the other quadrants of the coordinate axis shape of the first control gate CGA, e.g., first to third quadrants, respectively.

Similarly, the second control gate CGB may have a cross shape or coordinate axis shape including bars extended in the top-to-bottom and side-to-side directions around the fourth vertex of the pixel PX'-1. The second detection node DNB of the pixel PX'-1 may be disposed to fill a second quadrant of the coordinate axis shape of the second control gate CGB. Furthermore, the second detection nodes DNB of other pixels adjacent to the pixel PX'-1 may be disposed in the other quadrants of the coordinate axis shape of the second control gate CGB, e.g., first, third and fourth quadrants, respectively.

In such an arrangement, the first and second detection nodes DNA and DNB may come into contact with the first and second control gates CGA and CGB, respectively, across a wider area, and more easily capture photocharges that migrate along an electric potential difference or potential gradient formed by the first and second control gates CGA and CGB.

Figure 12B:
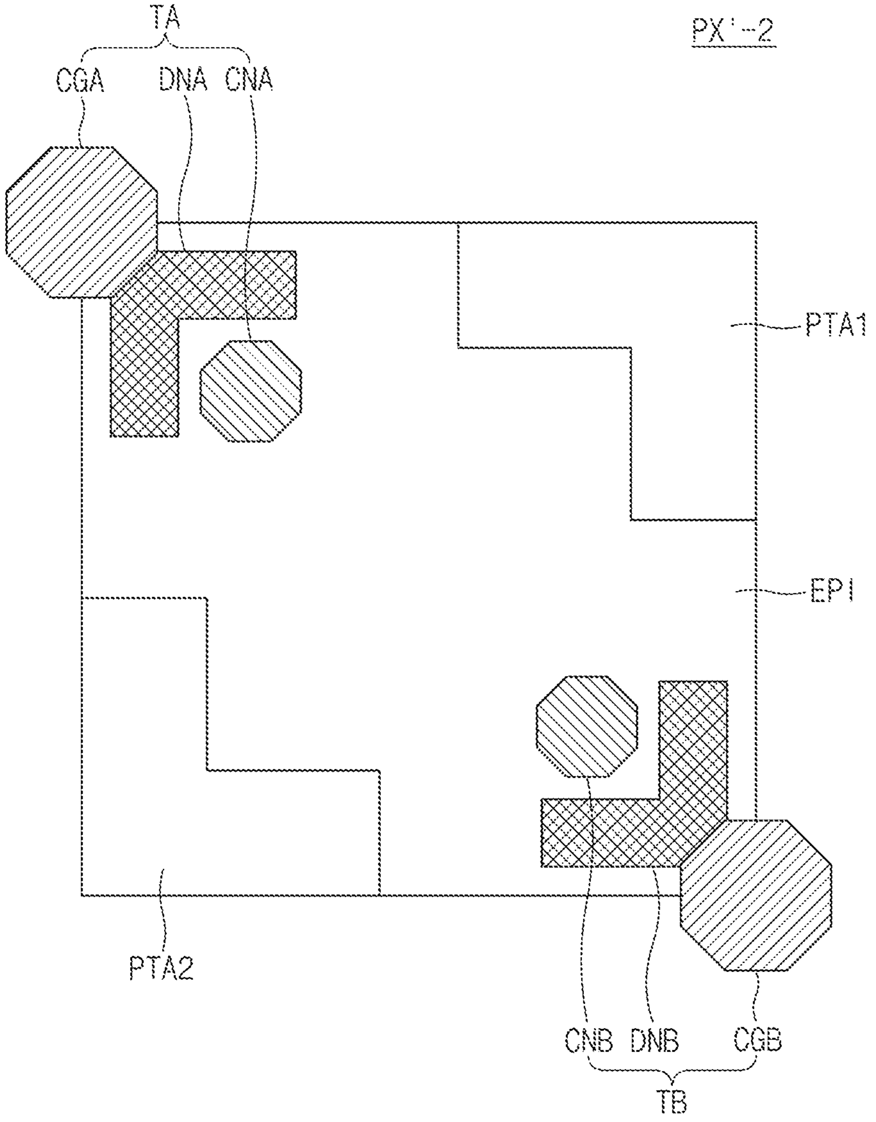
FIG. 12B is a diagram illustrating another example of the pixel illustrated in FIG. 8.

FIG. 12B is a diagram illustrating another example of the pixel illustrated in FIG. 8.

FIG. 12B illustrates a pixel PX'-2 corresponding to an embodiment configured by modifying the structure of the pixel PX' illustrated in FIG. 8. Since the pixel PX'-2 is substantially the same as the pixel PX' except some differences, the following descriptions will be focused on the differences.

The first detection node DNA may have a "L" shape to surround at least a part of the first control node CNA, and at least a part of the first detection node DNA may overlap or abut on the first control gate CGA. Furthermore, the second detection node DNB may have a "L" shape to surround at least a part of the second control node CNB, and at least a part of the second detection node DNB may overlap or abut on the second control gate CGB.

The first and second detection nodes DNA and DNB having such a shape may more easily capture photocharges that migrate along an electric potential difference or potential gradient formed by the control nodes CNA and CNB.

Figure 12C:
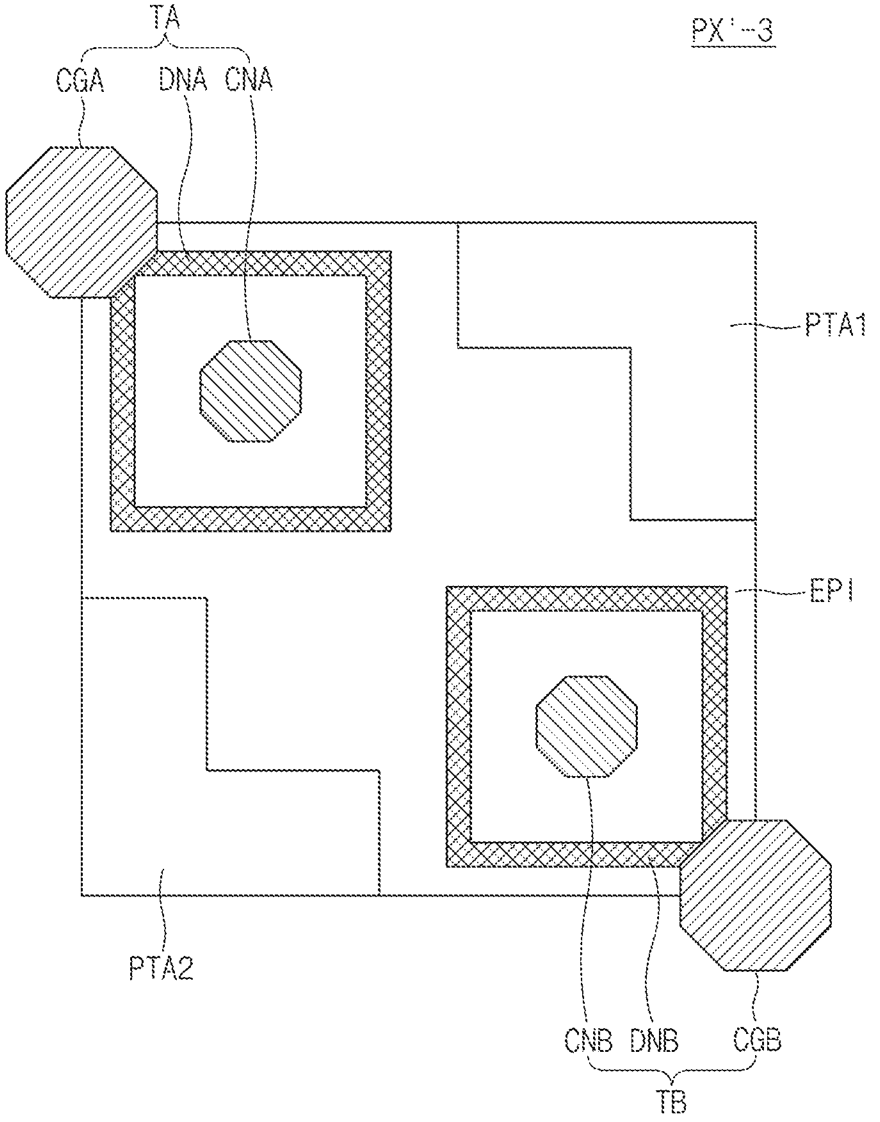
FIG. 12C is a diagram illustrating another example of the pixel illustrated in FIG. 8.

FIG. 12C is a diagram illustrating another example of the pixel illustrated in FIG. 8.

FIG. 12C illustrates a pixel PX'-3 corresponding to an embodiment configured by modifying the structure of the pixel PX' illustrated in FIG. 8. Since the pixel PX'-3 is substantially the same as the pixel PX' except some differences, the following descriptions will be focused on the differences.

The first detection node DNA may have a ring shape to surround the first control node CNA, and at least a part of the first detection node DNA may overlap or abut on the first control gate CGA. Furthermore, the second detection node DNB may have a ring shape to surround the second control node CNB, and at least a part of the second detection node DNB may overlap or abut on the second control gate CGB.

The first and second detection nodes DNA and DNB having such a shape may more easily capture photocharges that migrate along an electric potential difference or potential gradient formed by the control nodes CNA and CNB.

While various embodiments have been described above, the disclosed embodiments are merely examples of certain implementations. Accordingly, various modifications or enhancements to the disclosed embodiments and other embodiments can be made based on what is disclosed and/or illustrated in this patent document.

What is claimed is:

1. An image sensing device comprising:
- a plurality of pixel regions included in a substrate and structured to detect incident light and generate photocharges corresponding to an intensity of the incident light;
- a plurality of taps structured to generate an electric potential difference in the substrate and capture the photocharges generated by the plurality of pixel regions and migrated by the electric potential difference; and
- a demodulation driver configured to generate a demodulation control signal varying between an active voltage and an inactive voltage for generating the electric potential difference in the substrate, wherein each of the taps comprises:
- a control node disposed in the substrate and doped with a first conductive type impurity;
- a detection node disposed in the substrate and doped with a second conductive type impurity different from the first conductive type impurity; and
- a control gate structured to include a gate electrode and a gate dielectric layer for electrically isolating the gate electrode from the substrate,
- wherein the control node is disposed at a first side of the detection node, and the control gate is disposed at a second side of the detection node, wherein the second side is an opposite side of the first side, and
- wherein the demodulation driver applies the same demodulation control signal to the control node and the control gate in each of the taps.

2. The image sensing device of claim 1, wherein the gate electrode is electrically connected to the control node through a conductive structure disposed outside the substrate.

3. The image sensing device of claim 1, wherein the control node and the detection node are formed from a front side of the substrate toward inside the substrate, and wherein a depth of the control node from the front side is larger than a depth of the detection node from the front side.

4. The image sensing device of claim 1, wherein the detection node is disposed to abut on or overlap the control gate.

5. The image sensing device of claim 1, wherein the detection node is disposed to surround at least a part of the control node.

6. The image sensing device of claim 1, wherein the pixel regions include a first pixel region having four sides and four angles, and wherein the taps include a first tap and a second tap included in the first pixel region,
- the control node of the first tap is disposed at a first vertex of the first pixel region, and
- the control node of the second tap is disposed at a fourth vertex of the first pixel region facing the first vertex in a diagonal direction.

7. The image sensing device of claim 6, wherein the control node, the detection node and the control gate of each of the first and second taps are sequentially arranged toward a center of the first pixel in a diagonal direction connecting the first vertex and the fourth vertex of the first pixel region.

8. The image sensing device of claim 6, wherein the control gates of the first and second taps are disposed in a planar shape on a front side of the substrate.

9. The image sensing device of claim 6, wherein the control gates of the first and second taps are disposed in a recess formed in the substrate from a front side of the substrate.

10. The image sensing device of claim 9, wherein a depth of the control node from the front side is larger than a depth of the control gate from the front side.

11. The image sensing device of claim 6, wherein the pixel regions further include a second pixel region, a third pixel region and a fourth pixel region, and wherein the first to fourth pixel regions form a 2×2 matrix to share the control node disposed at the fourth vertex of the first pixel region.

12. The image sensing device of claim 1, wherein the pixel regions include a first pixel region having four sides and four angles, and wherein the taps comprise a first tap and a second tap included in a first pixel region,
- the control gate of the first tap is disposed at a first vertex of the first pixel region, and
- the control gate of the second tap is disposed at a fourth vertex of the first pixel region facing the first vertex in a diagonal direction.

13. The image sensing device of claim 12, wherein the control gate, the detection node and the control node of each of the first and second taps are sequentially arranged toward a center of the first pixel region in a diagonal direction connecting the first vertex and the fourth vertex of the first pixel region.

14. The image sensing device of claim 12, wherein the control gates of the first and second taps are disposed in a planar shape on a front side of the substrate.

15. The image sensing device of claim 12, wherein the control gates of the first and second taps are inserted into the substrate from a front side of the substrate and disposed in a recess formed on the substrate.

16. The image sensing device of claim 15, wherein a depth of the control gate from the front side is larger than a depth of the control node from the front side.

17. The image sensing device of claim 12, wherein the pixel regions further include a second pixel region, a third pixel region and a fourth pixel region, and wherein the first to fourth pixel regions form a 2×2 matrix to share the control gate disposed at the fourth vertex of the first pixel region.

18. An image sensing device comprising:
- a substrate including a plurality of pixel regions structured to detect incident light and generate photocharges corresponding to an intensity of the incident light, a back side of the substrate being structured to receive incident light;
- a plurality of taps included in the substrate and structured to be located closer to a front side of the substrate than the back side, generate an electric potential difference in the substrate and capture the photocharges generated by the plurality of pixel regions and migrated by the electric potential difference; and a demodulation driver configured to generate a demodulation control signal varying between an active voltage and an inactive voltage for generating the electric potential difference in the substrate, wherein each of the taps comprises:

a control node disposed in the substrate and doped with a first conductive type impurity;

a detection node disposed in the substrate and doped with a second conductive type impurity different from the first conductive type; and a control gate structured to include a gate electrode and a gate dielectric layer for electrically isolating the gate electrode and the substrate from each other, wherein the control node, the detection node and the control gate of the tap are sequentially disposed in a diagonal direction of a pixel region including the tap, and wherein the demodulation driver applies the same demodulation control signal to the control node and the control gate in each of the taps.

19. The image sensing device of claim 18, wherein the pixel regions include a first pixel region having four sides and four angles, and wherein the taps include a first tap and a second tap included in the first pixel region, the control node of the first tap is disposed at a first vertex of the first pixel region, and the control node of the second tap is disposed at a fourth vertex of the first pixel region facing the first vertex in a diagonal direction.

* * * * *